United States Patent
Huh et al.

(10) Patent No.: US 10,133,692 B2
(45) Date of Patent: Nov. 20, 2018

(54) DEVICE INCLUDING A SINGLE WIRE INTERFACE AND A DATA PROCESSING SYSTEM HAVING THE SAME

(71) Applicant: SAMSUNG ELECTRONICS CO., LTD., Suwon-si, Gyeonggi-Do (KR)

(72) Inventors: Junho Huh, Yongin-si (KR); Horang Jang, Seoul (KR); Tomas Scherrer, Yongin-si (KR); Jaewon Lee, Gwacheon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 211 days.

(21) Appl. No.: 15/190,629

(22) Filed: Jun. 23, 2016

(65) Prior Publication Data

US 2017/0060791 A1 Mar. 2, 2017

(30) Foreign Application Priority Data

Aug. 24, 2015 (KR) .......................... 10-2015-0118994

(51) Int. Cl.
| | | |
|---|---|---|
| G06F 13/16 | (2006.01) | |
| G06F 13/36 | (2006.01) | |
| G06F 13/42 | (2006.01) | |
| G11C 8/10 | (2006.01) | |

(Continued)

(52) U.S. Cl.
CPC ...... *G06F 13/1689* (2013.01); *G06F 13/1673* (2013.01); *G06F 13/36* (2013.01); *G06F 13/4282* (2013.01); *G11C 7/1066* (2013.01); *G11C 7/1093* (2013.01); *G11C 7/222* (2013.01); *G11C 2207/10* (2013.01); *Y02D 10/14* (2018.01); *Y02D 10/151* (2018.01)

(58) Field of Classification Search
None
See application file for complete search history.

(56) References Cited

U.S. PATENT DOCUMENTS

| | | | |
|---|---|---|---|
| 6,178,161 B1 | 1/2001 | Terry | |
| 6,292,015 B1 * | 9/2001 | Ooishi | G11O 5/147 326/101 |
| 7,376,020 B2 | 5/2008 | Sorrells et al. | |

(Continued)

FOREIGN PATENT DOCUMENTS

| | | |
|---|---|---|
| JP | 10-013393 | 1/1998 |
| JP | 2003-157230 | 5/2003 |
| KR | 10-0946686 | 3/2010 |

OTHER PUBLICATIONS

Office Action dated Dec. 15, 2016 in corresponding U.S. Appl. No. 15/072,470.

*Primary Examiner* — Idriss N Alrobaye
*Assistant Examiner* — Dayton Lewis-Taylor
(74) *Attorney, Agent, or Firm* — F. Chau & Associates, LLC

(57) ABSTRACT

A system including: a master device configured to generate a first signal having a periodic pulse, wherein the first signal includes data; and a slave device including a pin, a delay circuit, a buffer, and a processing circuit, wherein the slave device receives the first signal at the pin, delays the first signal with the delay circuit to generate a second signal having a first delay, delays the first signal with the buffer to generate a third signal having a second delay, and reads the data from the second signal using the third signal at the processing circuit.

19 Claims, 20 Drawing Sheets

(51) Int. Cl.
*G11C 7/10* (2006.01)
*G11C 7/22* (2006.01)

(56) References Cited

U.S. PATENT DOCUMENTS

| | | |
|---|---|---|
| 7,406,100 B2 | 7/2008 | Rocas et al. |
| 7,519,005 B2 | 4/2009 | Hejdeman et al. |
| 7,752,365 B2 | 7/2010 | Taylor et al. |
| 7,881,415 B2 | 2/2011 | Ng |
| 8,315,331 B2 | 11/2012 | Saito et al. |
| 8,509,318 B2 | 8/2013 | Tailliet |
| 8,694,710 B2 | 4/2014 | Bas et al. |
| 8,711,418 B2 | 4/2014 | Cho |
| 8,719,613 B2 | 5/2014 | Neben |
| 8,750,324 B2 | 6/2014 | Hansquine et al. |
| 8,775,707 B2 | 7/2014 | Poulsen |
| 9,015,393 B2 | 4/2015 | Korpinen et al. |
| 2005/0175120 A1* | 8/2005 | Gater ............... H04L 25/4902 375/316 |
| 2006/0187969 A1* | 8/2006 | Kadowaki ............... H04L 5/16 370/516 |
| 2007/0086267 A1* | 4/2007 | Kwak ..................... G11C 7/02 365/233.1 |
| 2009/0249025 A1* | 10/2009 | Fujisawa ............. G06F 9/3869 712/1 |
| 2013/0246675 A1 | 9/2013 | Korpinen et al. |
| 2013/0322461 A1 | 12/2013 | Poulsen |
| 2014/0189178 A1 | 7/2014 | Wang |
| 2014/0281082 A1 | 9/2014 | Bagger |
| 2014/0304443 A1 | 10/2014 | Poulsen |
| 2014/0351359 A1 | 11/2014 | Grocutt et al. |
| 2015/0074306 A1 | 3/2015 | Ayyagari et al. |
| 2015/0149672 A1 | 5/2015 | Mishra et al. |
| 2016/0294544 A1 | 10/2016 | Jang et al. |

* cited by examiner

DEVICE INCLUDING A SINGLE WIRE INTERFACE AND A DATA PROCESSING SYSTEM HAVING THE SAME

CROSS-REFERENCE TO RELATED APPLICATION

This application claims priority under 35 U.S.C. § 119 to Korean Patent Application No. 10-2015-0118994 filed on Aug. 24, 2015, the disclosure of which is incorporated by reference herein in its entirety.

TECHNICAL FIELD

Exemplary embodiments of the inventive concept relate to an integrated circuit, and more particularly, to a master device and a slave device which communicate with each other using a single wire interface and a data processing system including the master device and the slave device.

DISCUSSION OF RELATED ART

Serial communication is the process of sending data one bit at a time, sequentially, over a communication channel or a computer bus. Parallel communication is a method of conveying multiple binary digits (bits) simultaneously.

Many communication systems are designed to connect two integrated circuits on a printed circuit board (PCB). Integrated circuits cost more when they have more pins. To reduce the number of pins, integrated circuits may use a serial bus to transfer data. Some examples of such low-cost serial buses include a serial peripheral interface (SPI), an inter-integrated circuit (I2C), and the like.

The SPI bus is a synchronous serial communication interface used for short distance communication, particularly in embedded systems. The SPI bus uses three pins or four pins. However, output drivers and input buffers are connected with each of the pins, and thus, the cost of a chip with SPI is increased.

I2C is a multi-master, multi-slave, single-ended, serial computer bus. I2C is typically used to connect low-speed peripheral devices in an embedded system, a mobile phone, or the like, to processors and microcontrollers. I2C uses two bidirectional open-drain lines, in other words, a serial data line (SDA) and a serial clock line (SCL), pulled up with resistors. However, since I2C sends serial data using a serial clock for synchronizing two connected devices, a chip with I2C consumes a lot of power. Furthermore, since I2C charges an output capacitor using a resistor, an operating speed of a chip with I2C is slower.

SUMMARY

An exemplary embodiment of the inventive concept provides a system. The system including: a master device configured to generate a first signal having a periodic pulse, wherein the first signal includes data; and a slave device including a pin, a delay circuit, a buffer, and a processing circuit, wherein the slave device receives the first signal at the pin, delays the first signal with the delay circuit to generate a second signal having a first delay, delays the first signal with the buffer to generate a third signal having a second delay, and reads the data from the second signal using the third signal at the processing circuit.

The first delay may be greater than the second delay.

The data may be read from the second signal at a rising edge of the third signal.

The data may be read from the second signal at a falling edge of the third signal.

A value of the data may be based on a duty ratio of the first signal.

The value of the data may be 0 when logic high duration of the data is less than half of a single periodic pulse, and the value of the data may be 1 when logic high duration of the data is greater than half of a single periodic pulse.

The value of the data may be 1 when logic high duration of the data is less than half of a single periodic pulse, and the value of the data may be 0 when logic high duration of the data is greater than half of a single periodic pulse.

The processing circuit may include a latch.

The system may further include: an address decoding register configured to serially receive the data from the latch.

The address decoding register may include: a data storage unit configured to store the data received from the latch; a control logic configured to count a number of periods of the third signal and output a control signal when a predetermined number of the periods is reached; and an output register configured to output the data stored in the data storage unit in parallel in response to the control signal from the control logic.

The address decoding register may include: a data storage unit configured to store the data received from the latch, wherein the data includes header data, tail data and payload data; a control logic configured to output a control signal when the header and tail data meet a predetermined condition; and an output register configured to output the payload data in parallel in response to the control signal output from the control logic.

The master device may include a pin through which the first signal is output.

The pin of the master device and the pin of the slave device are connected to each other with a single line.

The master device may include a signal generator to generate the first signal.

An exemplary embodiment of the inventive concept provides a device. The device including: a single pin configured to receive a first signal, the first signal including data and having a periodic pulse; a delay circuit configured to delay the first signal and generate a second signal having a first delay; a buffer configured to delay the first signal and generate a third signal having a second delay; and a processing circuit configured to read the data from the second signal using the third signal.

The first delay may be longer than the second delay.

The third signal may be a clock signal and the second signal may be a data signal.

The data may be read from the second signal at a rising edge or falling edge of the first signal.

The data may be varied according to a duty ratio of the first signal.

The device may operate in a low power mode when reading the data from the second signal.

The device may not include an internal clock source.

An exemplary embodiment of the inventive concept provides a method of operating a slave device. The method including: receiving, via a pin, a first signal that includes data and has a periodic pulse; delaying, with a delay circuit, the first signal to generate a second signal having a first delay; delaying, with a buffer, the first signal to generate a third signal having a second delay; and reading, with a processing circuit, the data from the second signal using the third signal, wherein the data is read from the second signal at a rising edge or a falling edge of the third signal.

A value of the data may correspond to a duty ratio of the first signal.

The value of the data may be 0 when logic high duration of the data is less than half of a single periodic pulse, and the value of the data may be 1 when logic high duration of the data is greater than half of a single periodic pulse.

DETAILED DESCRIPTION OF THE EMBODIMENTS

The inventive concept will now be described more fully hereinafter with reference to accompanying drawings in which exemplary embodiments thereof are shown. The inventive concept may, however, be embodied in many different forms and should not be construed as being limited to the embodiments set forth herein.

Figure 1:
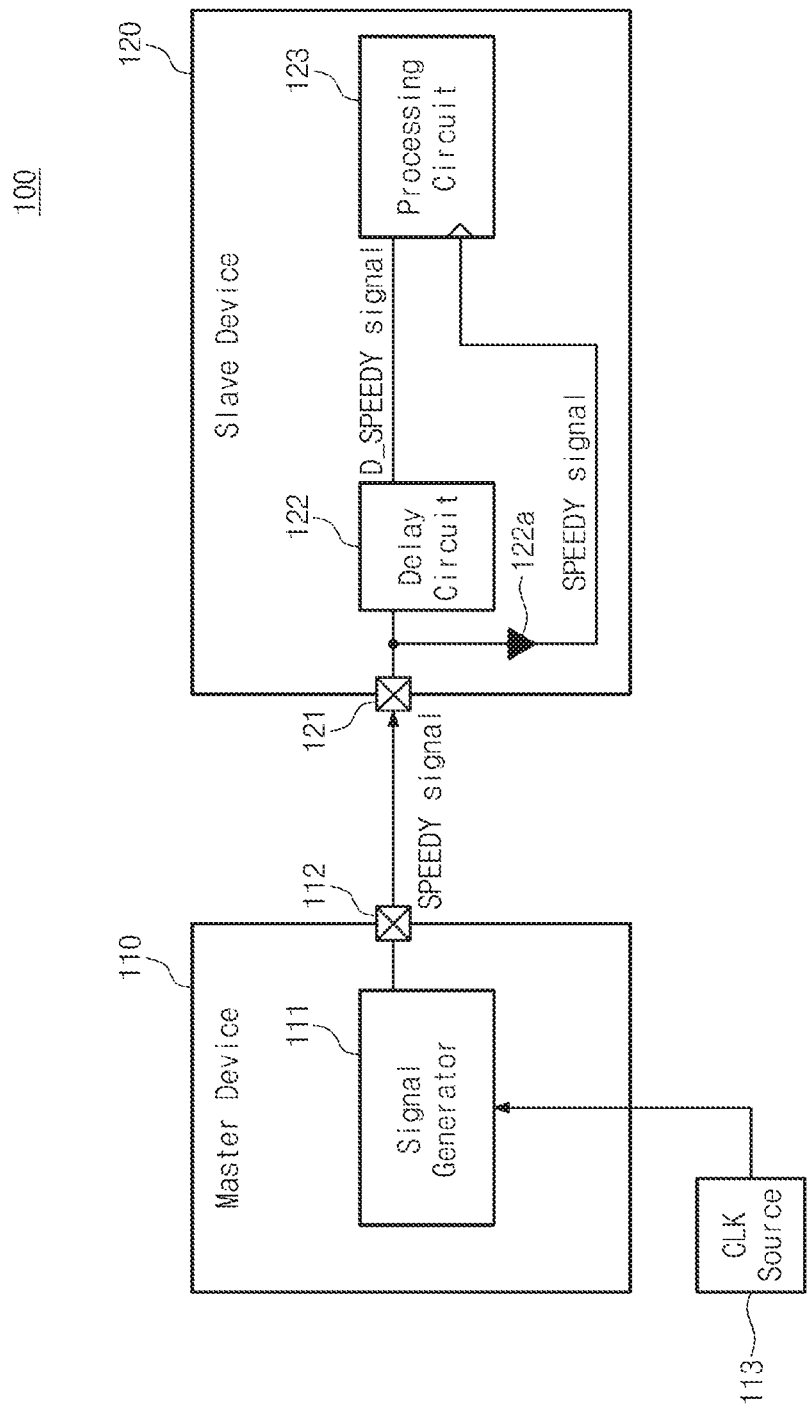
FIG. 1 is a block diagram illustrating a data processing system according to an exemplary embodiment of the inventive concept.

FIG. 1 is a block diagram illustrating a data processing system 100 according to an exemplary embodiment of the inventive concept. Referring to FIG. 1, the data processing system 100 may include a master device 110 and a slave device 120 and may send and receive a SPEEDY signal over a single wire. SPEEDY may be a digital signal transmitted in a serial protocol.

The master device 110 may be a controller circuit or a processor which is capable of controlling the slave device 120. For example, the master device 110 may be implemented with, but not limited to, a baseband modem processor chip, a chip capable of performing both a function of a modem and a function of an application processor (AP), an AP, or a mobile AP.

The master device 110 may include a signal generator 111 and a first pin 112. The signal generator 111 may receive a clock signal from an external clock source 113 and may generate the SPEEDY signal using the received clock signal. The signal generator 111 may transfer the SPEEDY signal to the slave device 120 through the first pin 112.

According to an exemplary embodiment of the inventive concept, the signal generator 111 may generate the SPEEDY signal which includes both clock information and data information. In other words, the SPEEDY signal may include both clock information and data information. To include the clock information in the SPEEDY signal, for example, the signal generator 111 may constantly maintain an interval between rising edges of the SPEEDY signal or an interval between falling edges of the SPEEDY signal. In other words, a falling edge or a rising edge of the SPEEDY signal may be periodically generated. Hereinafter, the term "an interval between a falling edge" may correspond to the terms "a falling edge period", or "a periodic falling edge". The term "an interval between a rising edge" may correspond to the terms "a rising edge period", or "a periodic rising edge". Furthermore, to include data information in the SPEEDY signal, the signal generator 111 may adjust a duty ratio of the SPEEDY signal to vary according to corresponding data information.

The slave device 120 may be implemented with, but not limited to, a radio frequency integrated circuit (RFIC), a connectivity chip, a fingerprint recognition chip, a power management IC, a power supply module, a digital display interface chip, a display driver IC (DDIC), or a touch screen controller.

The slave device 120 may include a second pin 121, a delay circuit 122, a buffer 122a, and a processing circuit 123. The slave device 120 may receive the SPEEDY signal through the second pin 121 and may read data information, included in the SPEEDY signal, using the SPEEDY signal and a delayed SPEEDY (D_SPEEDY) signal.

For example, the second pin 121 may receive the SPEEDY signal from the first pin 112 of the master device 110. The first pin 112 and the second pin 121 may be implemented with, but not limited to, a contact pin or a contact pad. The first pin 112 and the second pin 121 may constitute a single wire, and there may be provided a single pin interface or a single bus interface which sends both clock information and data information over the single wire. The single wire may be implemented with, but not limited to, an electrical transmission line, for example, a microstrip line which is capable of being manufactured with a printed circuit board (PCB) technique.

The delay circuit 122 may receive the SPEEDY signal from the second pin 121. The delay circuit 122 may delay the SPEEDY signal and may generate the delayed SPEEDY signal D_SPEEDY. The delay circuit 122 may be implemented, for example, in the form of a delay chain in which delay cells are connected in series to each other.

The processing circuit 123 may receive the SPEEDY signal from the second pin 121 through the buffer 122a and may receive the delayed SPEEDY signal D_SPEEDY from the delay circuit 122. The buffer 122a may delay the SPEEDY signal. The buffer 122a may delay the SPEEDY signal by an amount less than the delay introduced by the delay circuit 122. According to an exemplary embodiment of the inventive concept, the processing circuit 123 may read data information included in the SPEEDY signal by using the SPEEDY signal as a clock signal and the delayed SPEEDY signal D_SPEEDY as a data signal.

For example, the processing circuit 123 may sample a voltage level (or a logic level) of the delayed SPEEDY signal D_SPEEDY at a point in time corresponding to a rising edge or a falling edge of the SPEEDY signal, and thus may read data information included in the SPEEDY signal. For example, when a rising edge of the SPEEDY signal is periodic (or is generated periodically), the processing circuit 123 may sample a voltage level (or a logic level) of the delayed SPEEDY signal D_SPEEDY every rising edge of the SPEEDY signal, and thus may read data information included in the SPEEDY signal.

As described above, the data processing system 100 according to an exemplary embodiment of the inventive concept may perform an interface operation using the SPEEDY signal including both data information and clock information. This may mean that each of the master device 110 and the slave device 120 in the data processing system 100 uses just one pin for transmission and reception of data information and clock information. Therefore, the number of pins used to implement the data processing system 100 may be reduced. As the number of pins is reduced, an area used to implement an integrated circuit may be also reduced.

For example, according to an inter-integrated circuit (I2C) interface technique, each of a master device and a slave device may use at least two pins to transmit and receive a clock signal and a data signal. In other words, each of the master device and the slave device may use a pin for transmitting and receiving a clock signal as well as a pin for transmitting and receiving a data signal. However, each of the master device 110 and the slave device 120 in the data processing device 100 according to an exemplary embodiment of the inventive concept may include just one pin for transmission and reception of the SPEEDY signal, thereby reducing an area for implementing an integrated circuit compared to the I2C interface technique.

Further, since the slave device 120 receives clock information from the master device 110, the slave device 120 may not include a component such as a ring oscillator or a resistor-capacitor (RC) oscillator. In this case, since a component for generating an internal clock does not have to be driven, power used to generate the internal clock may not be consumed, thereby enabling the data processing system 100 to be driven with less power.

Figure 2:
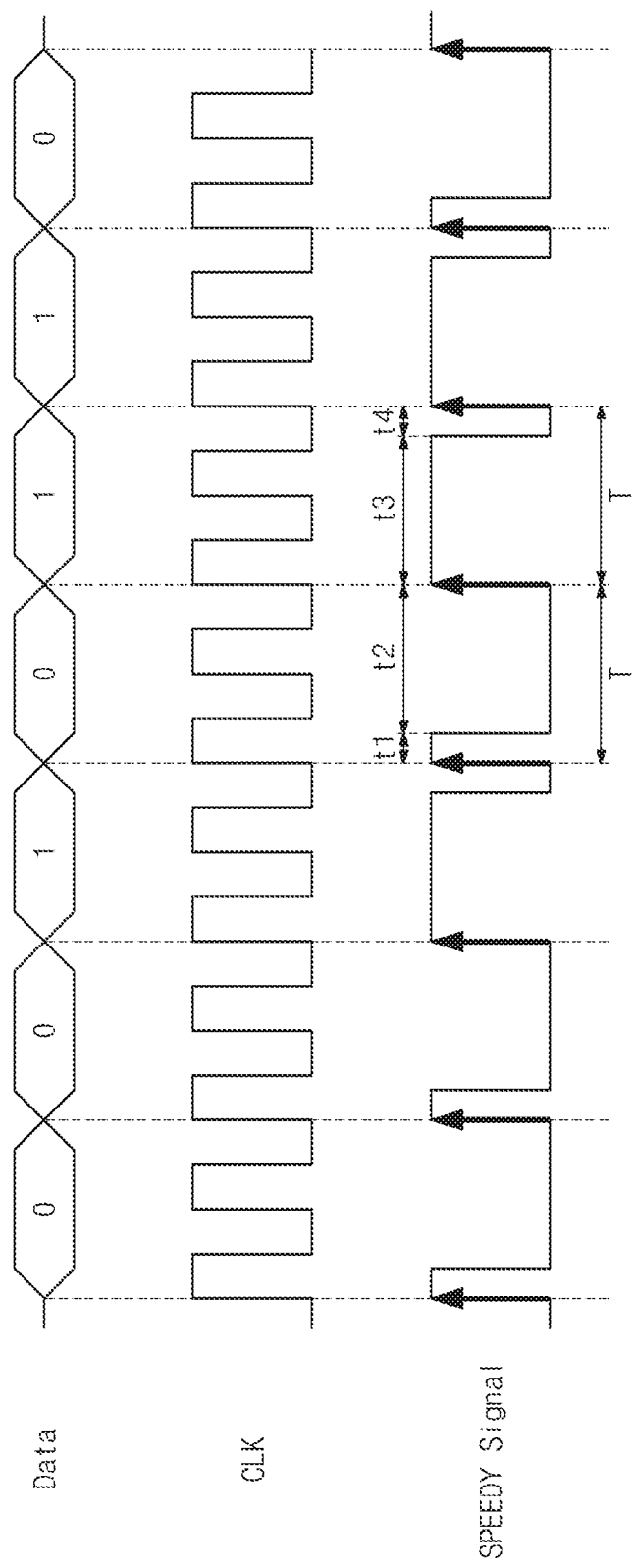
FIG. 2 is a timing diagram showing an operation in which a master device of FIG. 1 generates a SPEEDY signal, according to an exemplary embodiment of the inventive concept.

FIG. 2 is a timing diagram showing an operation in which the master device 100 of FIG. 1 generates the SPEEDY signal. For descriptive convenience, it is assumed that the rising edge (or a low-to-high transition) of the SPEEDY signal is periodic. However, the inventive concept may not be limited thereto. For example, in the SPEEDY signal, a falling edge (or a high-to-low transition) may be periodic. Here, the term "signal with a periodic rising edge" may mean that a signal has a periodically rising edge (or a low-to-high transition that happens in periodic fashion).

Referring to FIG. 2, the signal generator 111 of the master device 110 may generate the SPEEDY signal having a periodic rising edge, based on a clock signal CLK. In other words, the signal generator 111 may be synchronized with a rising edge of the clock signal CLK and may constantly maintain an interval between rising edges of the SPEEDY signal to have a period T. Since the rising edge of the SPEEDY signal is periodically generated, the SPEEDY signal may be used as a clock signal in the slave device 120.

Further, the signal generator 111 of the master device 110 may generate the SPEEDY signal which has a duty ratio varying according to corresponding data information. For example, when generating the SPEEDY signal corresponding to data "0", the signal generator 111 may adjust a duty ratio of the SPEEDY signal such that t1 is shorter than t2, in other words, a duty ratio (t1/T) is smaller than 0.5. In addition, when generating the SPEEDY signal corresponding to data "1", the signal generator 111 may adjust a duty ratio of the SPEEDY signal such that t3 is longer than t4, in other words, a duty ratio (t3/T) is greater than 0.5. As another example, the signal generator 111 may adjust a duty ratio of the SPEEDY signal such that the duty ratio (t1/T) of the SPEEDY signal corresponding to data "0" is greater than the duty ratio (t3/T) of the SPEEDY signal corresponding to data "1".

Since a duty ratio of the SPEEDY signal is adjusted differently according to corresponding data, the delayed SPEEDY signal D_SPEEDY may be used as a data signal in the slave device 120.

The adjustment of a duty ratio of the SPEEDY signal may be variously made. For example, the signal generator 111 may adjust a duty ratio using an oversampled master clock signal CLK. In addition, the signal generator 111 may include a delay cell, and a duty ratio of the SPEEDY signal may be adjusted using the delay cell.

Figure 3:
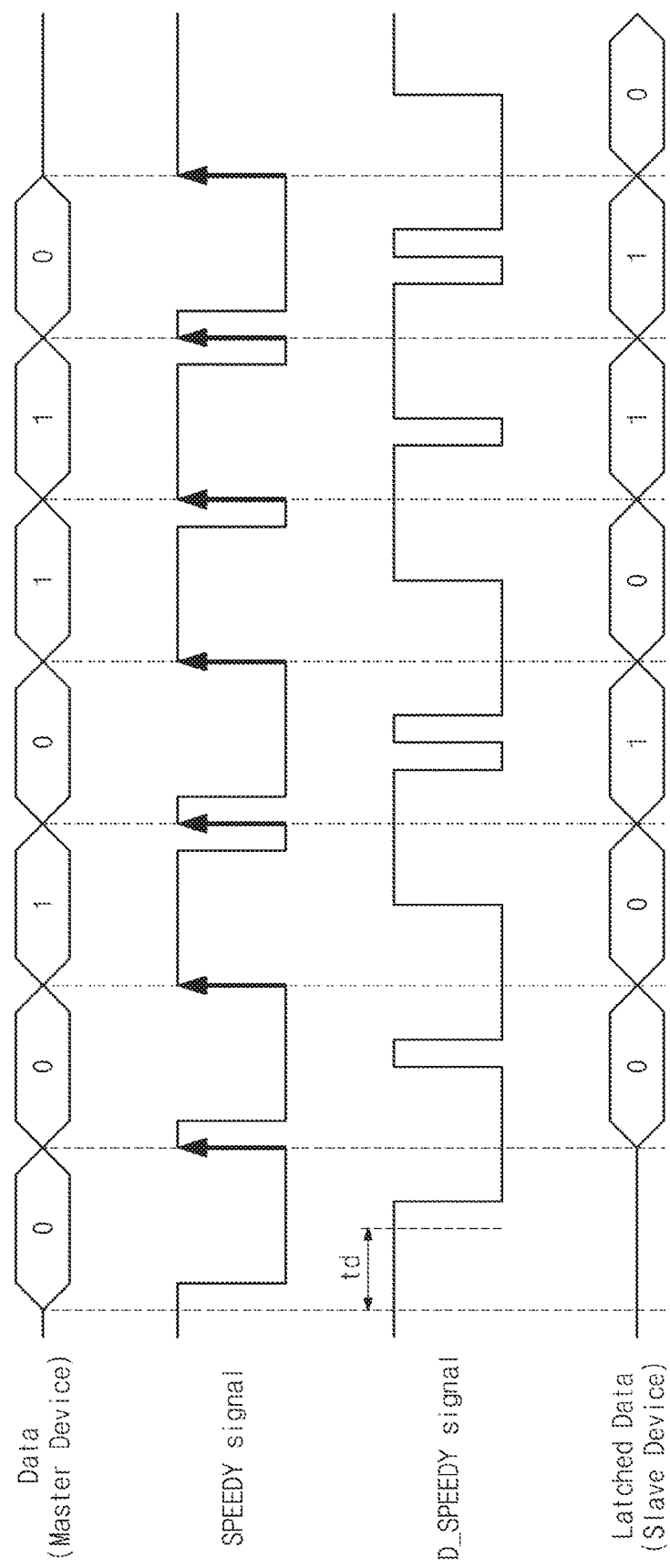
FIG. 3 is a timing diagram showing a data read operation of a slave device of FIG. 1, according to an exemplary embodiment of the inventive concept.

FIG. 3 is a timing diagram showing a data read operation of the slave device 120 of FIG. 1, according to an exemplary embodiment of the inventive concept. For descriptive convenience, it is assumed that the SPEEDY signal generated in FIG. 2 is sent to the slave device 120 from the master device 110.

Referring to FIG. 3, the SPEEDY signal which is received through the second pin 121 may be delayed by "td" through the delay circuit 122. The delayed SPEEDY signal D_SPEEDY and the SPEEDY signal may be transferred to the processing circuit 123, and the processing circuit 123 may read data using the delayed SPEEDY signal D_SPEEDY as a data signal and the SPEEDY signal as a clock signal.

Below, an operation of the processing circuit 123 will be more fully described. The processing circuit 123 may receive a rising edge of the SPEEDY signal as a clock and may check a voltage level (or a logic level) of the delayed SPEEDY signal D_SPEEDY at a point in time corresponding to a rising edge of the SPEEDY signal. For example, in the case where a voltage level of the delayed SPEEDY signal D_SPEEDY is "L" (e.g., low) at a point in time corresponding to the rising edge of the SPEEDY signal, the processing circuit 123 may determine data corresponding to the rising edge of the SPEEDY signal as "0". In the case where a voltage level of the delayed SPEEDY signal D_SPEEDY is "H" (e.g., high) at a point in time corresponding to the rising edge of the SPEEDY signal, the processing circuit 123 may determine data corresponding to the rising edge of the SPEEDY signal as "1". The processing circuit 123 may read data information sent from the master device 110 in the above-described manner.

The delay error in which a delay time becomes shorter or longer than the delay time "td" set by a user may occur when the delay circuit 122 delays the SPEEDY signal and generates the delayed SPEEDY signal D_SPEEDY. The delay error of the delay circuit 122 may change according to a defect of a process, a voltage level, a temperature, and the like.

To keep a data read operation from failing due to the delay error, the data processing system 100 according to an exemplary embodiment of the inventive concept may adjust a duty ratio of the SPEEDY signal based on a range of an expected delay error. For example, as the accuracy of the delay circuit 122 decreases (e.g., a large delay error is expected), an adjustment may be made such that a difference between a duty ratio (t1/T) (refer to FIG. 2) corresponding to data "0" and a duty ratio (t3/T) (refer to FIG. 2) corresponding to data "1" increases.

For example, in the case where the delay error of the delay circuit 122 is large, a duty ratio corresponding to data "0" to a duty ratio corresponding to data "1" may be set to 0.1:0.9. In addition, in the case where the delay error of the delay circuit 122 is small, a duty ratio corresponding to data "0" to a duty ratio corresponding to data "1" may be set to 0.3:0.7.

The above description is exemplary, and thus, the inventive concept may not be limited thereto. For example, in FIG. 1, the clock source 113 is placed outside the master device 110. However, the inventive concept may not be limited thereto. For example, the clock source 113 may be mounted on the master device 110. Furthermore, in FIG. 1, the slave device 120 does not receive a clock signal from an external device and does not include a clock generating component. However, the slave device 120 may be implemented to receive a clock signal from an external device or to include a circuit for generating a clock therein. In this case, the slave device 120 may use clock information of the SPEEDY signal, which is sent from the master device 110, to latch data at a high speed and may use a clock signal from an external device as a low-speed clock for a sleep mode.

Figure 4:
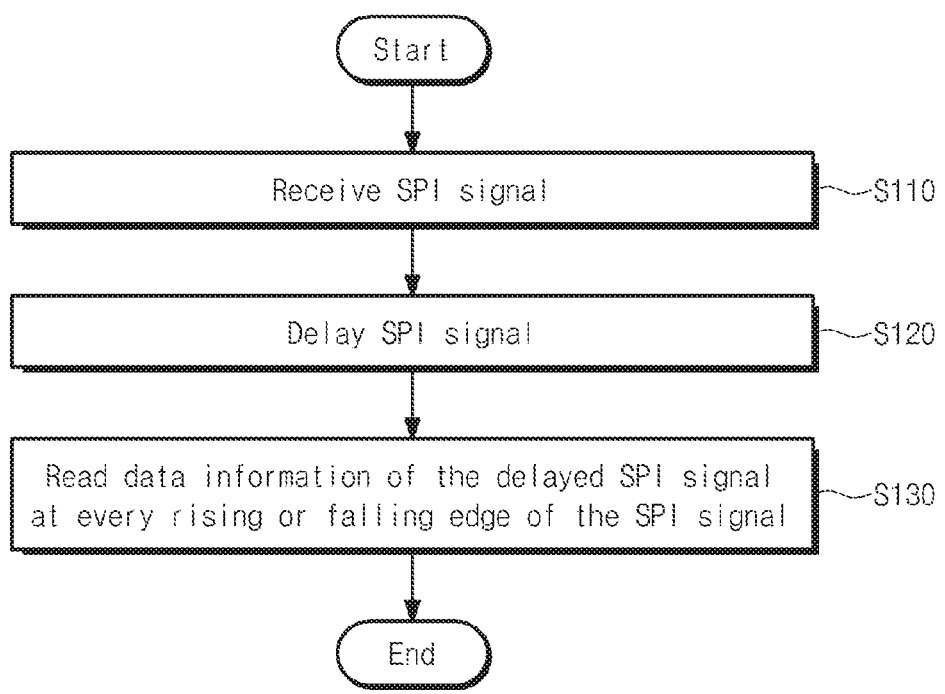
FIG. 4 is a flow chart illustrating an operation of a slave device of FIG. 1, according to an exemplary embodiment of the inventive concept.

FIG. 4 is a flow chart illustrating an operation of the slave device 120 of FIG. 1, according to an exemplary embodiment of the inventive concept.

In step S110, the slave device 120 may receive the SPEEDY signal through the second pad 121. The SPEEDY signal is shown as SPI in FIG. 4. The SPEEDY signal may be provided to the delay circuit 122 and the processing circuit 123, respectively.

In step S120, the delay circuit 122 may delay the SPEEDY signal to generate the delayed SPEEDY signal D_SPEEDY. The delay circuit 122 may delay the SPEEDY signal, for example, by "td", and "td" may have a delay time corresponding to 50% (or 0.5) of a duty ratio of the SPEEDY signal.

In step S130, the processing circuit 123 may read data information of the delayed SPEEDY signal D_SPEEDY every point in time corresponding to a rising edge or a falling edge of the SPEEDY signal. For example, the processing circuit 123 may receive the SPEEDY signal through the second pad 121 and may receive the delayed SPEEDY signal D_SPEEDY from the delay circuit 122. The processing circuit 123 may use each rising edge (or each falling edge) of the SPEEDY signal as a clock signal and the delayed SPEEDY signal D_SPEEDY as a data signal. The processing circuit 123 may read a voltage level (or a logic level) of the delayed SPEEDY signal D_SPEEDY at a point in time corresponding to each rising edge (or each falling edge) of the SPEEDY signal.

This way, the slave device 120 may receive the SPEEDY signal over one pin and may read data information included in the SPEEDY signal without separately receiving a clock signal from an external device.

Figure 5:
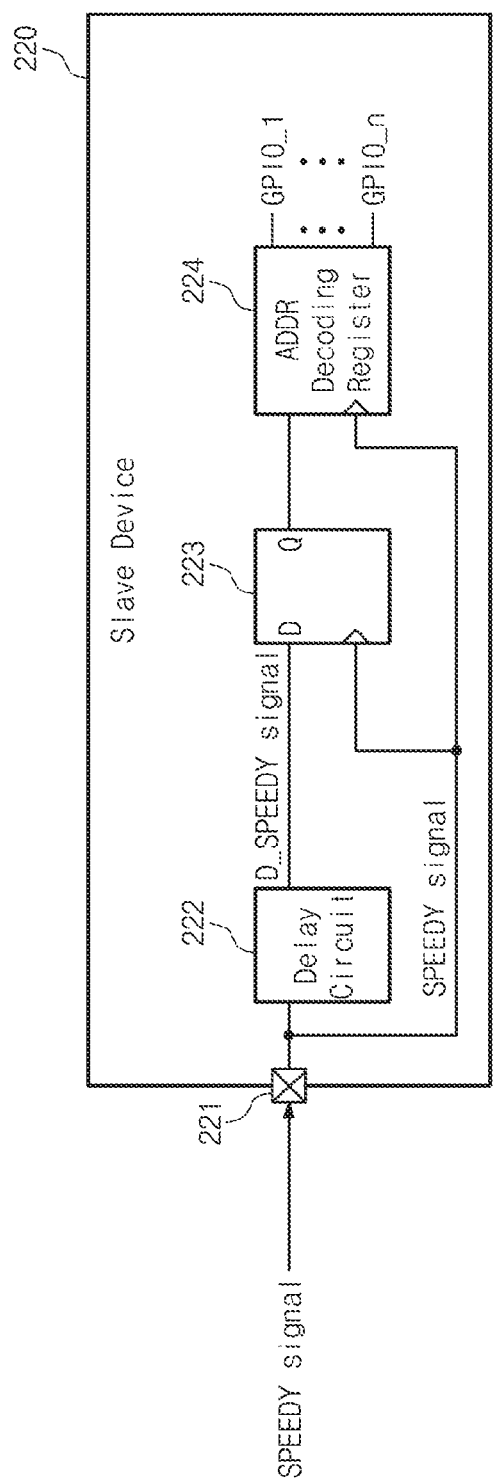
FIG. 5 is a block diagram illustrating a slave device according to an exemplary embodiment of the inventive concept.

FIG. 5 is a block diagram illustrating a slave device 220 according to an exemplary embodiment of the inventive concept. The slave device 220 illustrated in FIG. 5 may be similar to the slave device 120 illustrated in FIG. 1. Accordingly, similar components will be described using similar reference numerals. Further, for descriptive convenience, a difference between the slave devices 120 and 220 will be described. Referring to FIG. 5, the slave device 220 may include a second pin 221, a delay circuit 222, a flip-flop 223, and an address decoding register 224. The slave device 220 may also include the buffer 122a of FIG. 1.

As illustrated in FIG. 5, the slave device 220 may receive a SPEEDY signal through the pin 221 and may output data information included in the SPEEDY signal as a plurality of general purpose input/output (GPIO) values. In other words, the slave device 220 may serially receive data through one pin 221 and may decode the serially received data and output a plurality of GPIO values GPIO_1 to GPIO_n in parallel.

In general, for a master device and a slave device to exchange data through a GPIO interface, the slave device may have a plurality of physical GPIO pins which correspond to the GPIO interface. For example, if eight bits of parallel data are received at the slave device, the slave device will have eight physical GPIO pins. However, the slave device 220 according to an exemplary embodiment of the inventive concept may include one physical pin for data exchange with a master device, and thus, may be implemented in a small area compared to a slave device supporting a general GPIO function. Exemplary embodiments of the inventive concept supporting a GPIO function of FIG. 5 will be described with reference to FIGS. 6 to 10.

Figure 6:
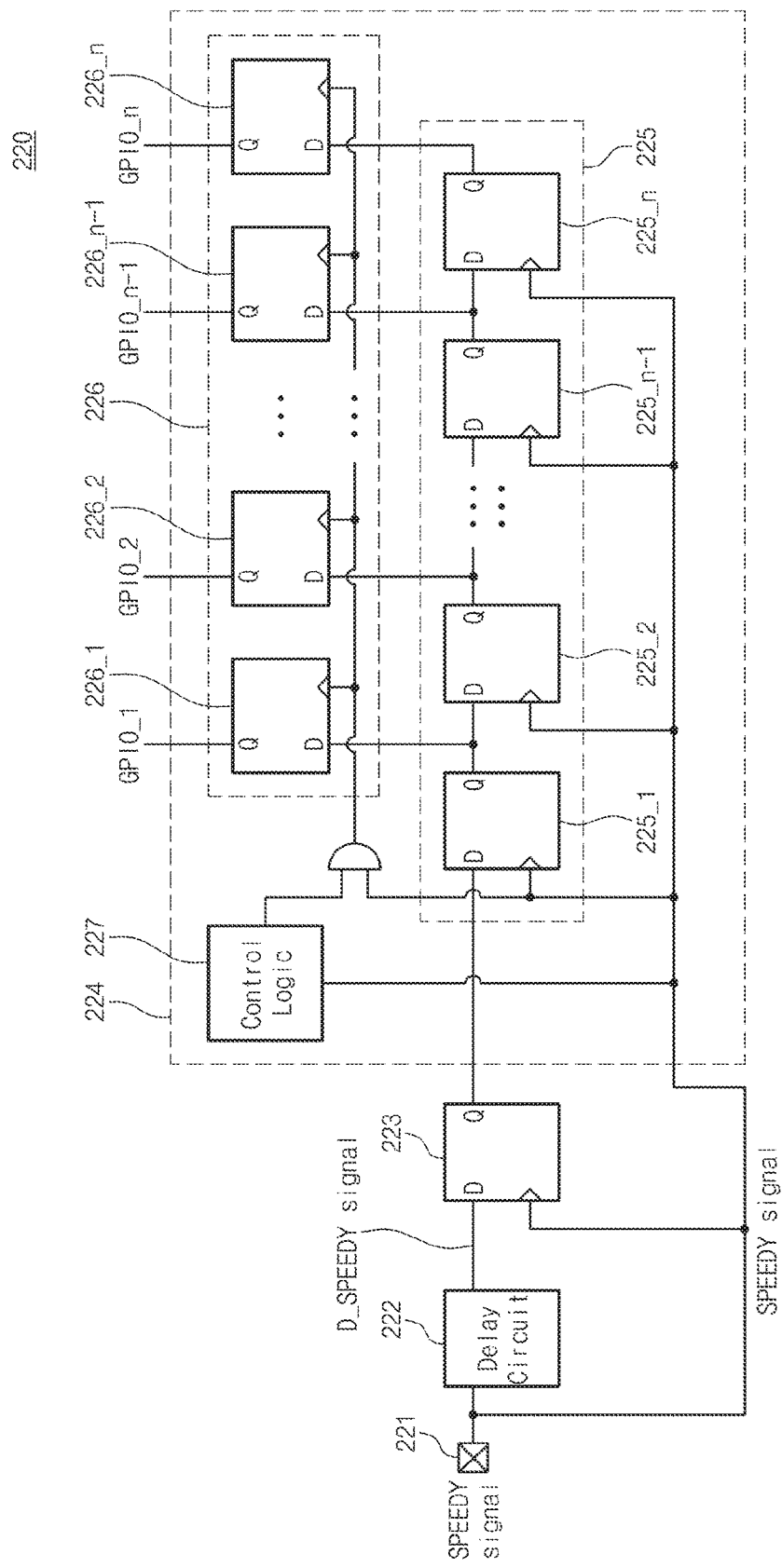
FIG. 6 is a block diagram illustrating the slave device illustrated in FIG. 5 in more detail, according to an exemplary embodiment of the inventive concept.
Figure 7:
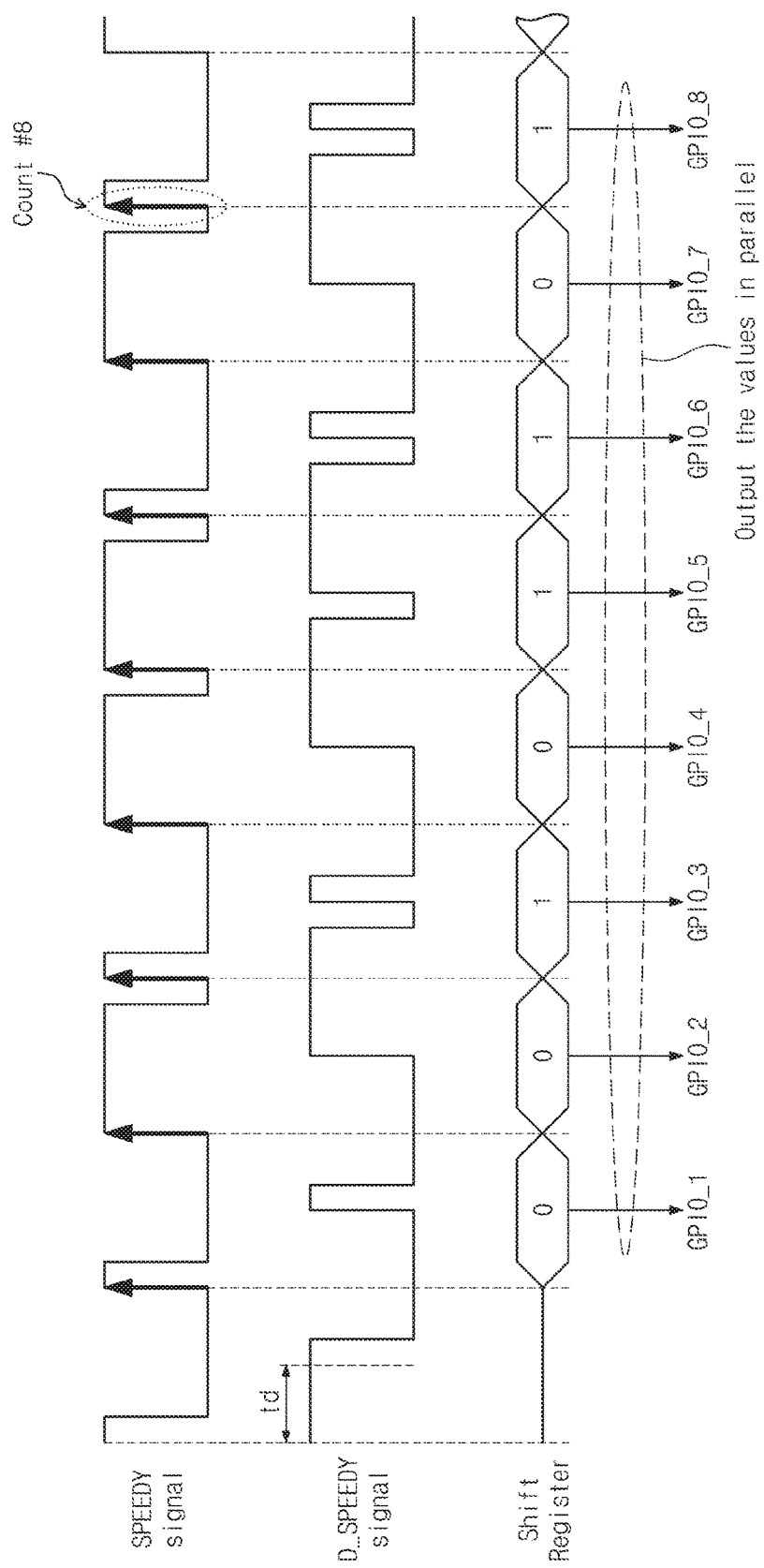
FIG. 7 is a timing diagram showing an operation of the slave device illustrated in FIG. 6, according to an exemplary embodiment of the inventive concept.

FIG. 6 is a block diagram illustrating the slave device 220 illustrated in FIG. 5, according to an exemplary embodiment of the inventive concept, and FIG. 7 is a timing diagram showing an operation of the slave device 220 illustrated in FIG. 6, according to an exemplary embodiment of the inventive concept.

Referring to FIG. 6, the slave device 220 may include the second pin 221, the delay circuit 222, the flip-flop 223, and the address decoding register 224. The address decoding register 224 may include a data storage unit 225, an output unit 226, and control logic 227.

The slave device 220 may receive the SPEEDY signal, sent from a master device, through the second pin 221. As illustrated in FIG. 7, a rising edge of the SPEEDY signal may be generated with a period, and a duty ratio of the SPEEDY signal may vary according to data.

The SPEEDY signal may be provided to the delay circuit 222 and the flip-flop 223, respectively, and the delay circuit 222 may delay the SPEEDY signal by "td" and may generate a delayed SPEEDY signal D_SPEEDY as illustrated in FIG. 7. The delay circuit 222 may provide the delayed SPEEDY signal D_SPEEDY to the flip-flop 223.

The flip-flop 223 may receive the SPEEDY signal and the delayed SPEEDY signal D_SPEEDY. The flip-flop 223 may latch the delayed SPEEDY signal D_SPEEDY every rising point in time of the SPEEDY signal. In other words, as illustrated in FIG. 7, when a voltage level (or a logic level) of the delayed SPEEDY signal D_SPEEDY is "L" at every rising point in time of the SPEEDY signal, the flip-flop 223 may latch data "0". In addition, when a voltage level (or a logic level) of the delayed SPEEDY signal D_SPEEDY is "H" at every rising point in time of the SPEEDY signal, the flip-flop 223 may latch data "1". Data latched by the flip-flop 223 may be sequentially transferred to the data storage unit 225.

The data storage unit 225 may receive the data from the flip-flop 223 and may receive the clock (e.g., a periodic rising edge or a periodic falling edge) from the SPEEDY signal. As illustrated in FIG. 6, the data storage unit 225 may be implemented in the form of, but not limited to, a shift register in which a plurality of flip-flops 225_1 to 225_n is connected in series. In the case where the data storage unit 225 is implemented in the form of a shift register, the data storage unit 225 may sequentially shift and store the data received from the flip-flop 223. For example, as illustrated in FIG. 7, the flip-flops 225_1 to 225_n of the data storage unit 225 may temporarily store data of "00101101".

The output unit 226 may be connected to the data storage unit 225 and may output the data stored at the data storage unit 225 in parallel. The output unit 226 may be implemented with, but not limited to, a plurality of flip-flops 226_1 to 226_n connected in parallel as illustrated in FIG. 6. In the case where the output unit 226 is implemented with the plurality of flip-flops 226_1 to 226_n, input terminals of the flip-flops 226_1 to 226_n may be connected to output terminals of the flip-flops 225_1 to 225_n of the data storage unit 225, respectively. Each of the flip-flops 226_1 to 226_n may receive a clock signal from the control logic 227.

The control logic 227 may control the data storage unit 225 and the output unit 226, and data stored at the data storage unit 225 may be simultaneously outputted through the output unit 226 under a control of the control logic 227. The control unit 227 may be designed to control the data storage unit 225 and the output unit 226 using an AND circuit as illustrated in FIG. 6. In this case, the control logic 227 may count a clock (e.g., a rising edge or a falling edge) of the SPEEDY signal to control an output operation of the output unit 226.

For example, as illustrated in FIG. 6, an output signal of the control logic 227 and the SPEEDY signal may be provided as inputs of the AND gate, and an output of the AND gate may be provided to the flip-flops 226_1 to 226_n of the output unit 226 as the clock. The control logic 227 may count a clock (e.g., a rising edge or a falling edge) of the SPEEDY signal and may output a signal of a low-to-high transition to the AND gate when the counted result is the same as a predetermined value. The control logic 227 may include a counter for the counting and may receive the predetermined value from a separate device.

At a point in time when an eighth rising edge of the SPEEDY signal is counted, as illustrated in FIG. 7, an output signal of the control logic 227 which is provided to the AND gate may have a low-to-high transition. In this case, since two high-level signals are applied to input terminals of the AND gate, the AND gate may output a high-level signal to clock terminals of the flip-flops 226_1 to 226_n in the output unit 226. Accordingly, the flip-flops 226_1 to 226_n in the output unit 226 may output the data stored in the data storage unit 225 as GPIO values at the same time. As illustrated in FIG. 7, the flip-flops 226_1 to 226_n in the output unit 226 may output the data stored at the flip-flops 225_1 to 225_n as first to eighth GPIO values GPIO_1 to GPIO_8.

As described above, the slave device 220 according to an exemplary embodiment of the inventive concept may receive a signal, which includes data information and clock information, over one physical pin and may output the received signal as a plurality of GPIO values in parallel. Therefore, the slave device 220 according to an exemplary embodiment of the inventive concept may be implemented in a small area compared to a slave device supporting a general GPIO function.

Figure 8:
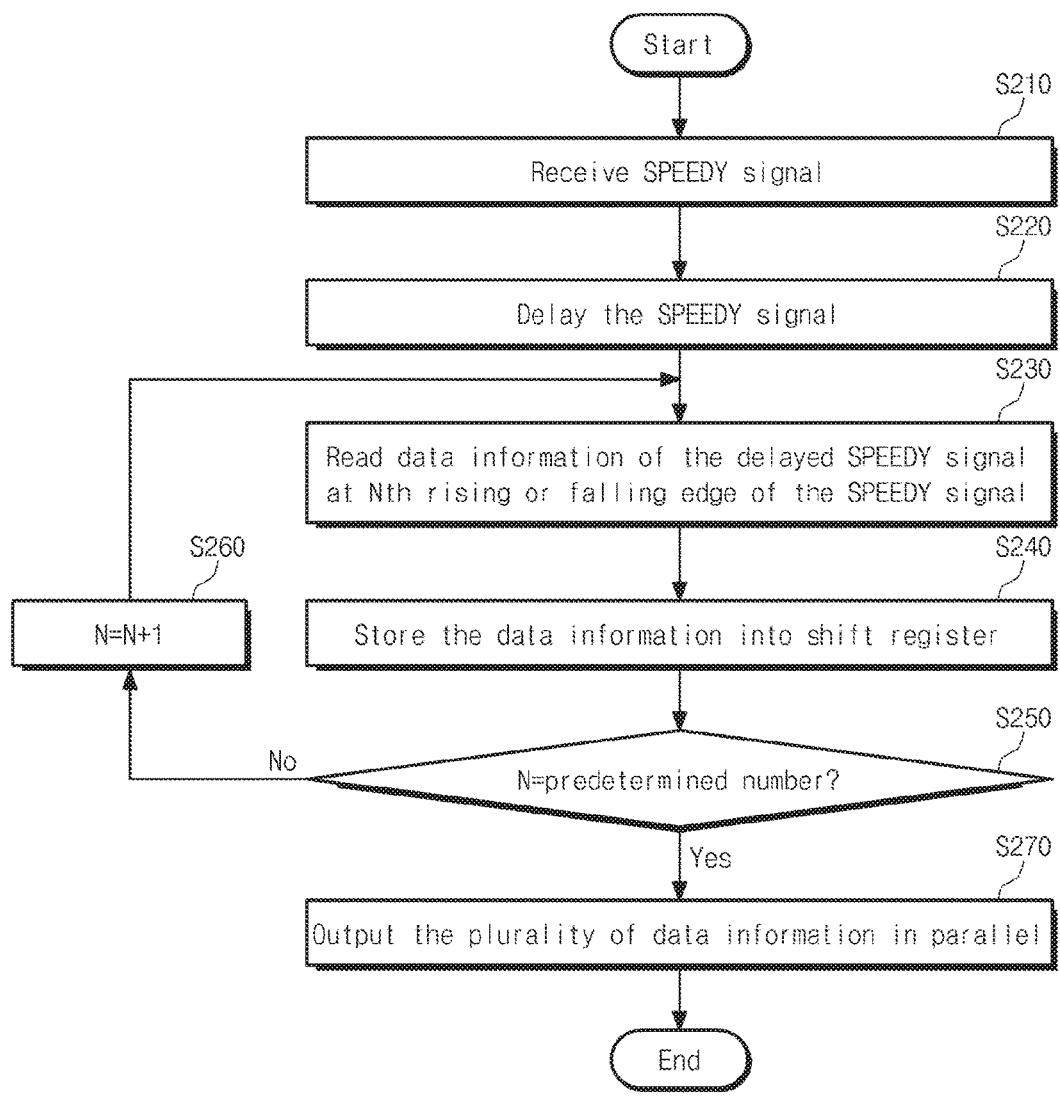
FIG. 8 is a flow chart of an operation of the slave device illustrated in FIG. 6, according to an exemplary embodiment of the inventive concept.

FIG. 8 is a flow chart of an operation of the slave device 220 illustrated in FIG. 6, according to an exemplary embodiment of the inventive concept.

In step S210, the slave device 220 may receive the SPEEDY signal over the second pin 221, and the SPEEDY signal may be provided to the delay circuit 222 and the flip-flop 223.

In step S220, the delay circuit 222 may delay the SPEEDY signal by a predetermined time and may provide the delayed SPEEDY signal D_SPEEDY to the flip-flop 223.

In step S230, the flip-flop 223 may read data from the delayed SPEEDY signal D_SPEEDY using the SPEEDY signal as a clock signal and the delayed SPEEDY signal as a data signal.

In step S240, data read by the flip-flop 223 may be sent to the data storage unit 225, and the data storage unit 225 may temporarily store the read data. For example, the data storage unit 225 may store the read data in a shift register as illustrated in FIG. 6. In this case, the data storage unit 225 may store sequentially inputted data in response to the clock of the SPEEDY signal such that the data is sequentially shifted into the flip-flops 225_1 to 225_n.

In step S250, the control logic 227 may determine whether a result of counting the clock of the SPEEDY signal is the same as a predetermined value. As illustrated in FIGS. 6 and 7, the control logic 227 may count rising edges of the SPEEDY signal and may determine whether the number of rising edges counted reaches a predetermined value.

If the number of rising edges counted is not the same as the predetermined value, the control logic 227 may not output the data stored at the data storage unit 225. In this case, at a next rising edge of the SPEEDY signal (S260), the flip-flop 223 may again perform operations S230, S240 and S250.

If the number of rising edges counted is the same as the predetermined value, the control logic 227 may control the data storage unit 225 and the output unit 226 such that the data information stored at the data storage unit 225 are outputted in parallel as a plurality of GPIO values (S270).

Accordingly, the data included in the SPEEDY signal may be outputted in parallel as a plurality of GPIO values.

Figure 9:
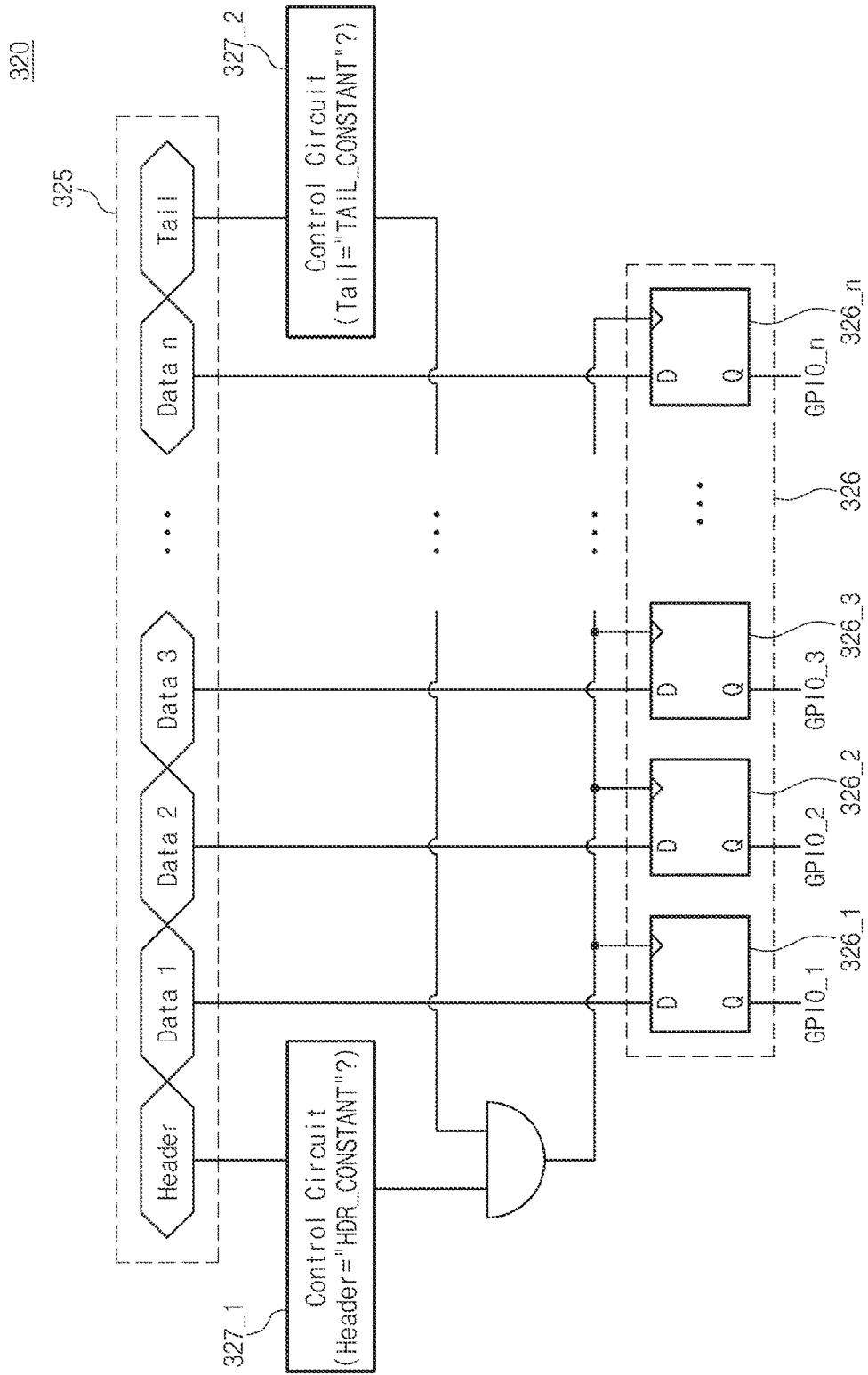
FIG. 9 is a block diagram illustrating a slave device according to an exemplary embodiment of the inventive concept.

FIG. 9 is a block diagram illustrating a slave device according to an exemplary embodiment of the inventive concept. A slave device 320 illustrated in FIG. 9 may be similar to the slave device 220 illustrated in FIG. 6 except for a configuration and an operation of a control logic, and thus, a difference between the slave devices in FIGS. 6 and 9 will be described below. According, similar components will be described using similar reference numerals, and a description on components the same as or similar to those in FIG. 6 may be omitted.

Referring to FIG. 9, data included in the SPEEDY signal may include header data and tail data as well as data assigned to a plurality of GPIOs GPIO_1 to GPIO_n. The control logic (327_1, 327_2) may perform control based on header and tail conditions such that data stored at the data storage unit 325 are outputted in parallel through flip-flops 326_1 to 326_n of an output unit 326.

For example, data included in the SPEEDY signal may include a header condition and a tail condition as well as data corresponding to a plurality of GPIOs as illustrated in FIG. 9. Outputs of first and second control circuits 327_1 and 327_2 may be connected to inputs of an AND gate and may transition from low to high when the header condition and the tail condition are respectively satisfied. Further, an output of the AND gate may be connected in common to clock terminals of the flip-flops 326_1 to 326_n of the output unit 326.

In view of the above description, each of outputs of the first and second control circuits 327_1 and 327_2 which are provided to the AND gate may transition from low to high when a corresponding one of the header condition and the tail condition included in the SPEEDY signal is satisfied. When both the header condition and the tail condition included in the SPEEDY signal are satisfied, the AND gate may provide a high-level signal to each of the clock terminals of the flip-flops 326_1 to 326_n in the output unit 326. In this case, data stored at the data storage unit 325 may be outputted in parallel to through the flip-flops 326_1 to 326_n of the output unit 326.

As described above, since a point in time when data stored at the data storage unit 325 are outputted may be adjusted according to the header condition and the tail condition, the occurrence of a glitch in the slave device 320 may be reduced.

Although FIG. 9 shows the control logic divided into the first control circuit 327_1 and the second control circuit 327_1, the inventive concept may not be limited thereto. For example, the first control circuit 327_1 and the second control circuit 327_1 may be physically integrated in one circuit. Further, although each of the control logic 227 in FIG. 6 and the control logic (327_1, 327_2) in FIG. 9 are connected to an AND gate, each of the control logic 227 in FIG. 6 and the control logic (327_1, 327_2) in FIG. 9 may be connected to a logic gate different from the AND gate. Further, each of the control logic 227 in FIG. 6 and the control logic (327_1, 327_2) in FIG. 9 may be implemented to perform an operation of a logic gate.

FIG. 9 shows that the SPEEDY signal includes header and tail conditions as well as data. However, the SPEEDY signal according to an exemplary embodiment of the inventive concept may include additional information related to a slave device. For example, in the case where a slave device supports an error detection function or an error correction function, the SPEEDY signal may include parity information as well as data.

Figure 10:
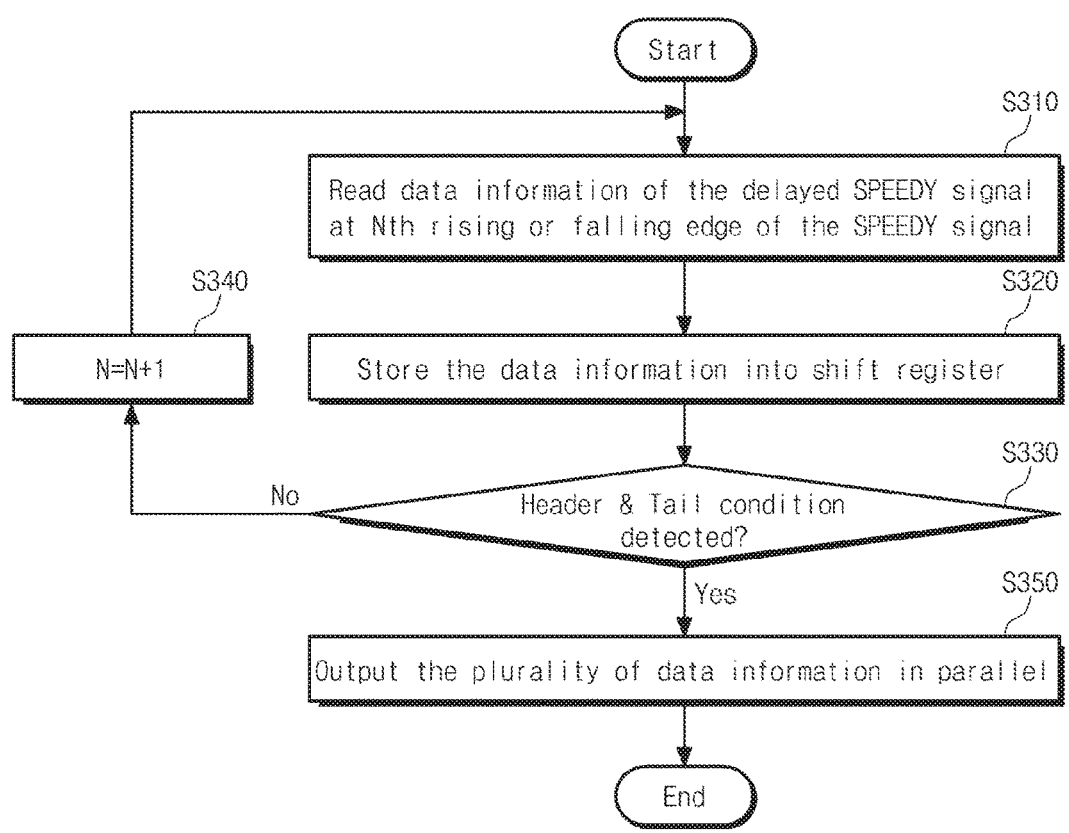
FIG. 10 is a flow chart of an operation of the slave device of FIG. 9, according to an exemplary embodiment of the inventive concept.

FIG. 10 is a flow chart of an operation of the slave device 320 of FIG. 9, according to an exemplary embodiment of the inventive concept.

In step S310, the flip-flop 223 (refer to FIG. 6) may read data from the delayed SPEEDY signal D_SPEEDY using the SPEEDY signal as a clock signal and the delayed SPEEDY signal D_SPEEDY as a data signal.

In step S320, the data read by the flip-flop 223 may be sent to the data storage unit 325, and the data storage unit 325 may temporarily store the inputted data.

In step S330, the first control circuit 327_1 may check whether a header condition of the SPEEDY signal is satisfied, and the second control circuit 327_2 may check whether a tail condition of the SPEEDY signal is satisfied.

If the header and tail conditions are not satisfied, the first and second control circuits 327_1 and 327_2 may delay an output of the data stored at the data storage unit 325 (S340). In this case, at a next rising edge of the SPEEDY signal, operations S310, S320 and S330 may again be performed.

If both of the header and tail conditions are satisfied, the first and second control circuits 327_1 and 327_2 may control the output unit 326 such that the data stored at the data storage unit 325 are outputted in parallel as a plurality of GPIOs (S350).

As such, a slave device according to an exemplary embodiment of the inventive concept may adjust a point in time when data are outputted in parallel, by using the header and tail conditions instead of counting a number of rising edges of the SPEEDY signal.

Figure 11:
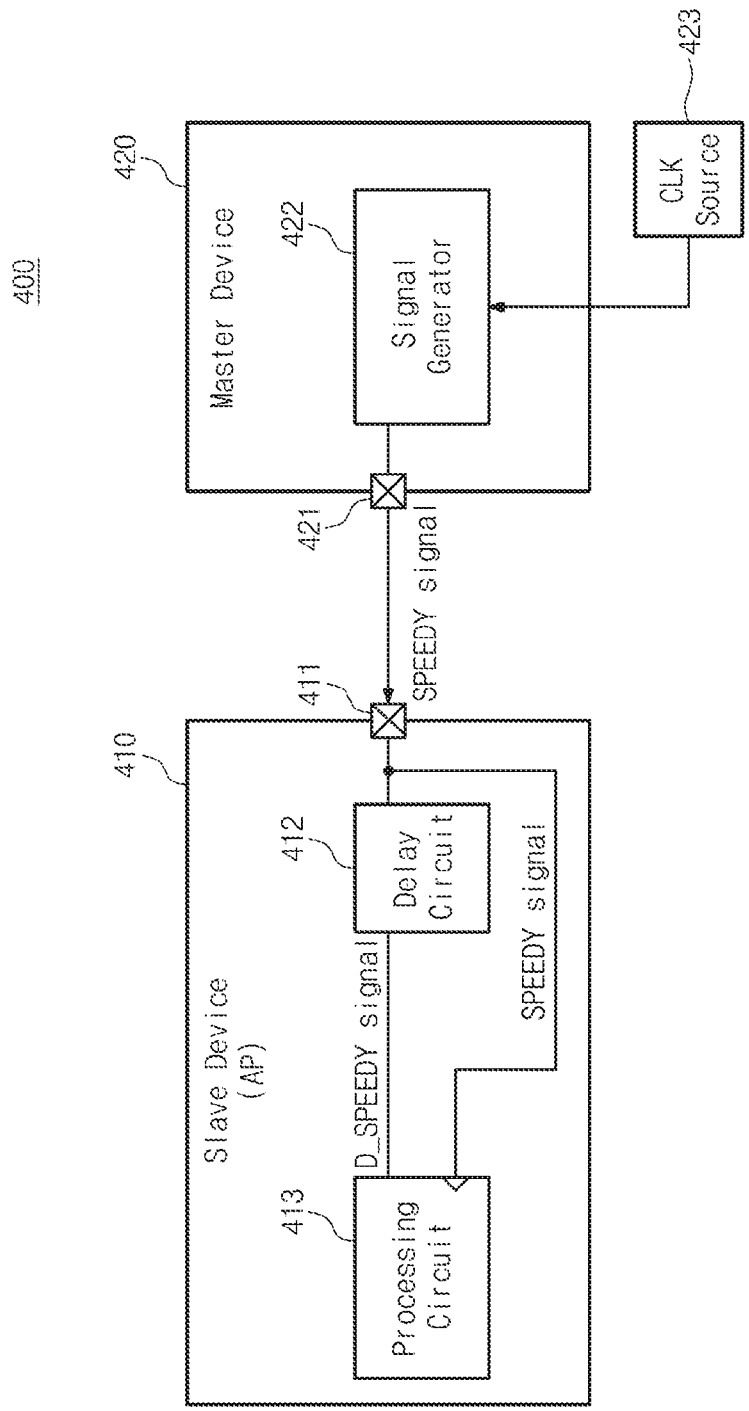
FIG. 11 is a block diagram illustrating a data processing system according to an exemplary embodiment of the inventive concept.

FIG. 11 is a block diagram illustrating a data processing system 400 according to an exemplary embodiment of the inventive concept. The data processing system 400 illustrated in FIG. 11 may be similar to the data processing system 100 illustrated in FIG. 1. Thus, similar components will be described using similar reference numerals. Below, a difference between the data processing systems 100 and 400 will be mainly described.

Referring to FIG. 11, a slave device 410 and a master device 420 may exchange data in a SPEEDY interface technique in which a SPEEDY signal is used. Unlike FIG. 1, the slave device 410 of FIG. 11 may be a processor, and a master device 420 may be, for example, a DDIC.

In FIG. 11, the slave device 410 may be implemented with, but not limited to, a baseband modem processor chip, a chip capable of performing a function of a modem and a function of an AP, an AP, or a mobile AP. The master device 420 may be implemented with, but not limited to, an RFIC, a connectivity chip, a fingerprint recognition chip, a power management IC, a power supply module, a digital display interface chip, a DDIC, or a touch screen controller. The slave device 410 may include a processing circuit 413, a delay circuit 412 and a first pin 411. The master device 420 may include a signal generator 422 and a second pin 421. The master device 420 may be connected to a clock source 423.

As illustrated in FIG. 11, when the AP enters a sleep mode for power saving, for example, the AP may operate as a slave of a SPEEDY interface, and the DDIC may operate as a master of the SPEEDY interface.

In general, when an AP enters a sleep mode, it may receive a 32-KHz sleep clock signal from an external device or it may generate the sleep clock signal internally. For example, in the case where a wake-up is required, a DDIC may send a data packet, which is slow in speed, to transfer an interrupt signal to the AP. The AP may decode the data packet by using the 32-KHz sleep clock signal and may perform a wake-up operation in response to the interrupt signal. In view of the above, the AP may continue to communicate with the DDIC at a low speed to cope with the wake-up operation in the sleep mode. In this case, on state of the low-speed sleep clock signal may be maintained.

On the contrary, as the slave device 410, the AP may receive both clock information and data information from the SPEEDY signal in the sleep mode. Further, the slave device 410 may generate an interrupt signal, requesting a wake-up operation, using the clock and data information included in the SPEEDY signal. Since the clock information included in the SPEEDY signal is higher in frequency than a sleep clock signal, switching the slave device 410 from the sleep mode to a wake-up state may be faster than that of the general AP described in the preceding paragraph. Further, since the slave device 410 does not have to check whether a data packet is received by using a sleep clock signal in the sleep mode, the slave device 410 may keep all of its clock signals off, and thus, power consumption of the AP illustrated in FIG. 11 may be reduced compared to the general AP.

Figure 12:
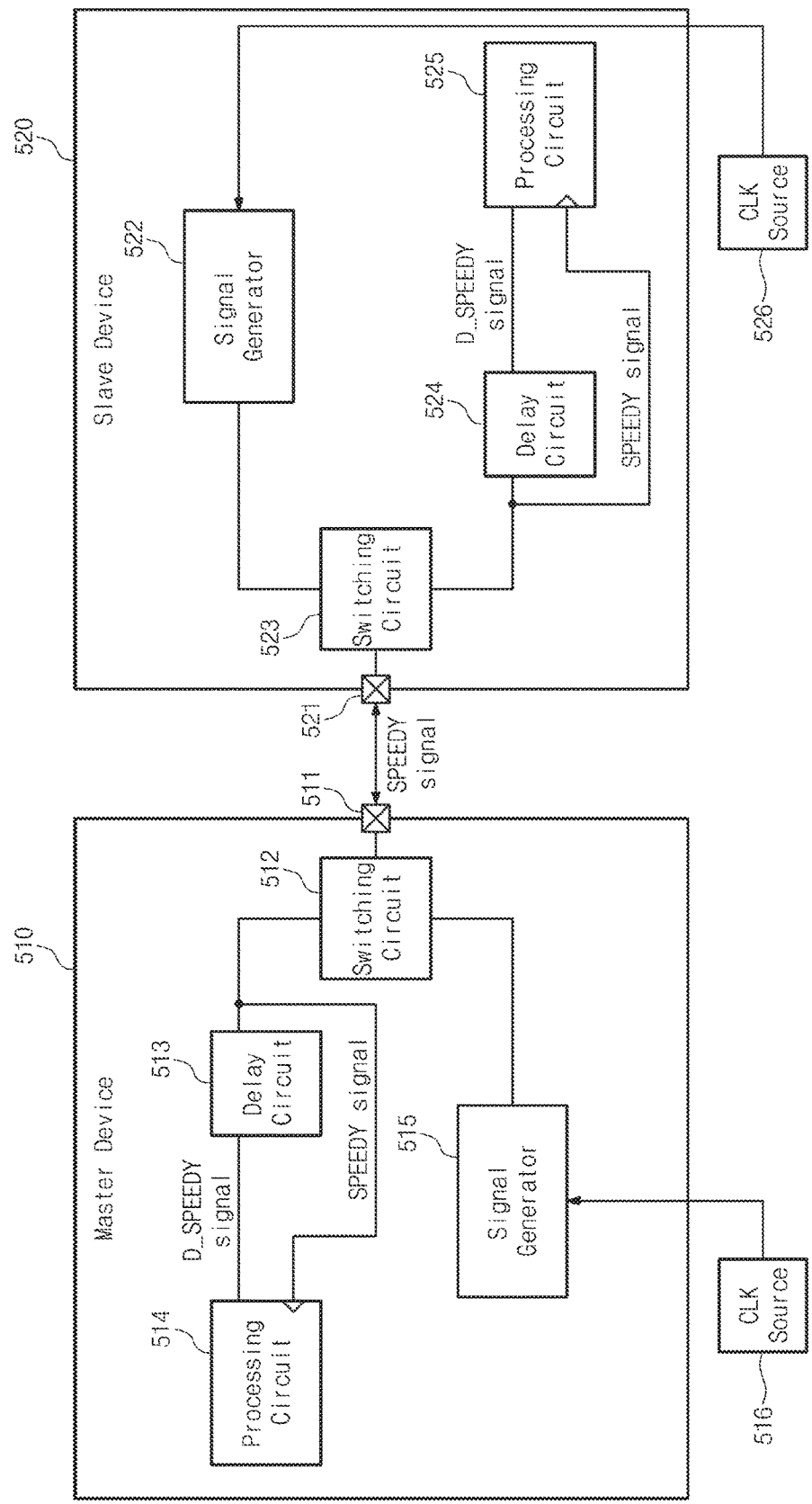
FIG. 12 is a block diagram illustrating a data processing system according to an exemplary embodiment of the inventive concept.

FIG. 12 is a block diagram illustrating a data processing system 500 according to an exemplary embodiment of the inventive concept. The data processing system 500 illustrated in FIG. 12 may be similar to the data processing systems 100 and 400 illustrated in FIGS. 1 and 11, thus, similar components will be described using similar reference numerals, and a difference therebetween may be omitted below.

Referring to FIG. 12, the data processing system 500 may include a master device 510 and a slave device 520, each of which includes a signal generator, a delay circuit, and a processing circuit. For example, the master device 510 may include a signal generator 515 for generating a SPEEDY signal and a delay circuit 513 and a processing circuit 514 which are used to receive and process the SPEEDY signal, and the slave device 520 may include a signal generator 522 for generating a SPEEDY signal and a delay circuit 524 and a processing circuit 525 which are used to receive and process the SPEEDY signal. Therefore, the data processing system 500 may provide bidirectional communication through a SPEEDY interface. To provide a bidirectional SPEEDY interface using a single wire, the master device 510 and the slave device 520 may further include a switching circuit 512 and a switching circuit 523, respectively. The master device 510 may be connected to a clock source 516 and the slave device 520 may be connected to a clock source 526.

For example, in the case where the master device 510 generates the SPEEDY signal and transfers it to the slave device 520, the switching circuit 512 of the master device 510 may provide a communication path between the signal generator 515 and a first pin 511, and the switching circuit 523 of the slave device 520 may provide a communication path between a second pin 521 and the delay circuit 524. In the case where the slave device 520 generates the SPEEDY signal and transfers it to the master device 510, the switching circuit 523 of the slave device 520 may provide a communication path between the signal generator 522 and the second pin 521, and the switching circuit 512 of the master device 510 may provide a communication path between the first pin 511 and the delay circuit 513.

In view of the above-described switching operation and SPEEDY signal transmitting and receiving method, the data processing system 500 may provide a bidirectional SPEEDY interface using a single wire.

Figure 13:
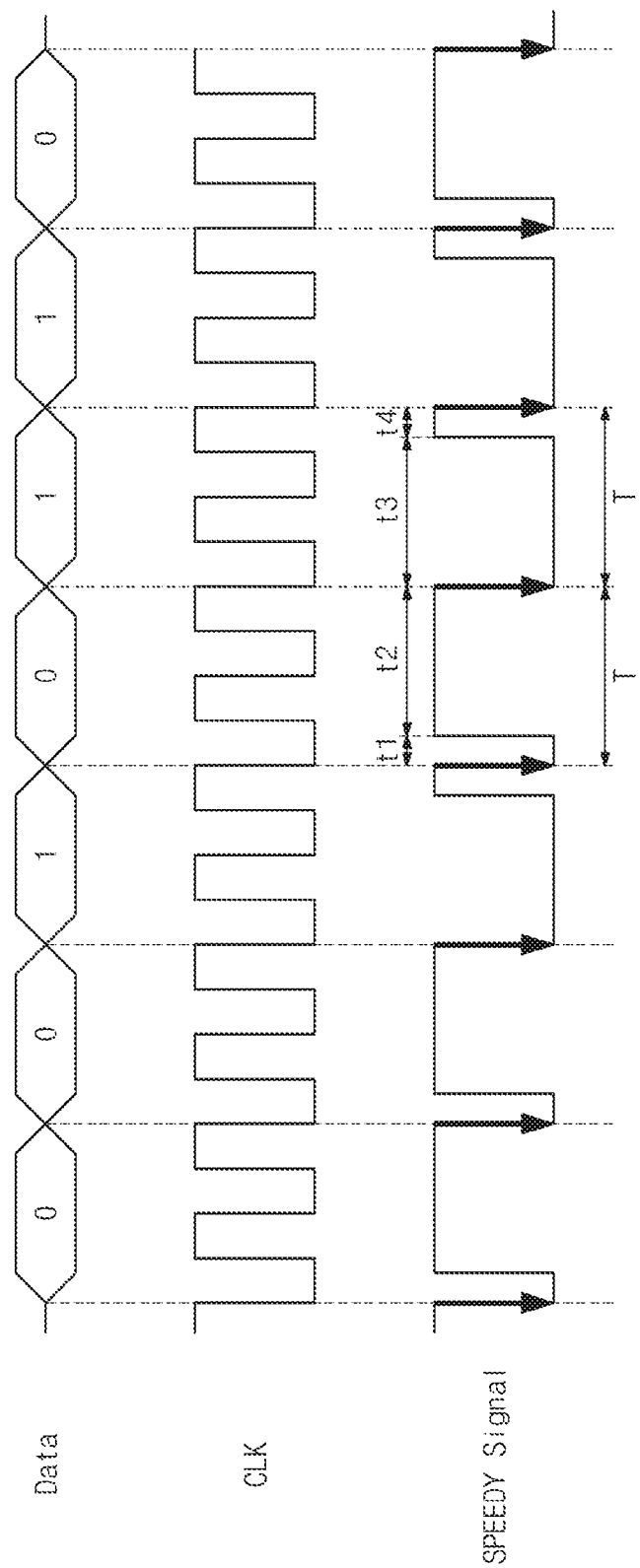
FIG. 13 is a timing diagram illustrating generation of a SPEEDY signal having a periodic falling edge, according to an exemplary embodiment of the inventive concept.
Figure 14:
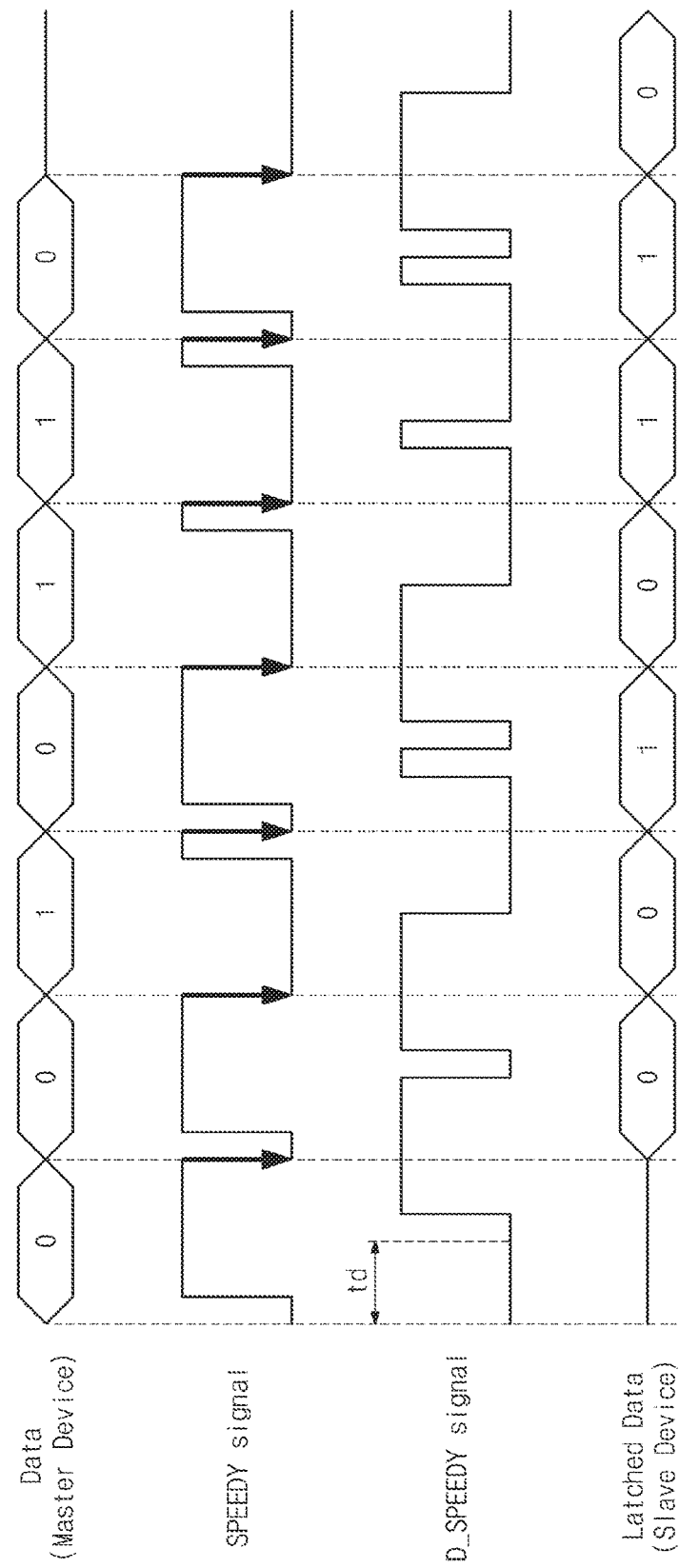
FIG. 14 is a timing diagram illustrating reading of data with a SPEEDY signal having a periodic falling edge, according to an exemplary embodiment of the inventive concept.

FIG. 13 is a timing diagram illustrating generation of a SPEEDY signal having a periodic falling edge, according to an exemplary embodiment of the inventive concept. FIG. 14 is a timing diagram illustrating reading data with a SPEEDY signal having a periodic falling edge, according to an exemplary embodiment of the inventive concept. The operations described with reference to FIGS. 13 and 14 may be accomplished by the data processing system 100 illustrated in FIG. 1. The operations described with reference to FIGS. 13 and 14 may be similar to those described with reference to FIGS. 2 and 3, and thus a difference therebetween may be described below.

Referring to FIGS. 1 and 13, the signal generator 111 of the master device 110 may generate a SPEEDY signal in which an interval between a falling edge and a next falling edge is constant. Since the falling edges are periodically generated, the slave device 120 may use the SPEEDY signal as a clock signal.

To include data information in the SPEEDY signal, the signal generator 111 of the master device 110 may adjust a duty ratio of the SPEEDY signal based on corresponding data. In this case, unlike the SPEEDY signal of FIG. 2, the SPEEDY signal of FIG. 13 may be changed such that a duty ratio (t2/T) of the SPEEDY signal corresponding to data "0" is greater than that (t4/T) corresponding to data "1". For example, the duty ratio (t2/T) of the SPEEDY signal corresponding to data "0" may be greater than 0.5, and the duty ratio (t4/T) of the SPEEDY signal corresponding to data "1" may be smaller than 0.5.

Referring to FIGS. 1 and 14, the delay circuit 122 of the slave device 120 may delay the SPEEDY signal by "td" and may generate a delayed SPEEDY signal D_SPEEDY. The processing circuit 123 of the slave device 120 may receive the SPEEDY signal from the second pin 121 and may receive the delayed SPEEDY signal D_SPEEDY from the delay circuit 122. The processing circuit 123 may read data information using the SPEEDY signal as a clock signal and the delayed SPEEDY signal D_SPEEDY as a data signal.

In this case, unlike FIG. 3, when a voltage level (or a logic level) of the delayed SPEEDY signal D_SPEEDY is "H", the processing circuit 123 may read data corresponding thereto as "0"; and when a voltage level (or a logic level) of the delayed SPEEDY signal D_SPEEDY is "L", the processing circuit 123 may read data corresponding thereto as "1".

As described with reference to FIGS. 13 and 14, a data processing system according to an exemplary embodiment of the inventive concept may transfer a clock signal to a slave device using a falling edge.

Figure 15:
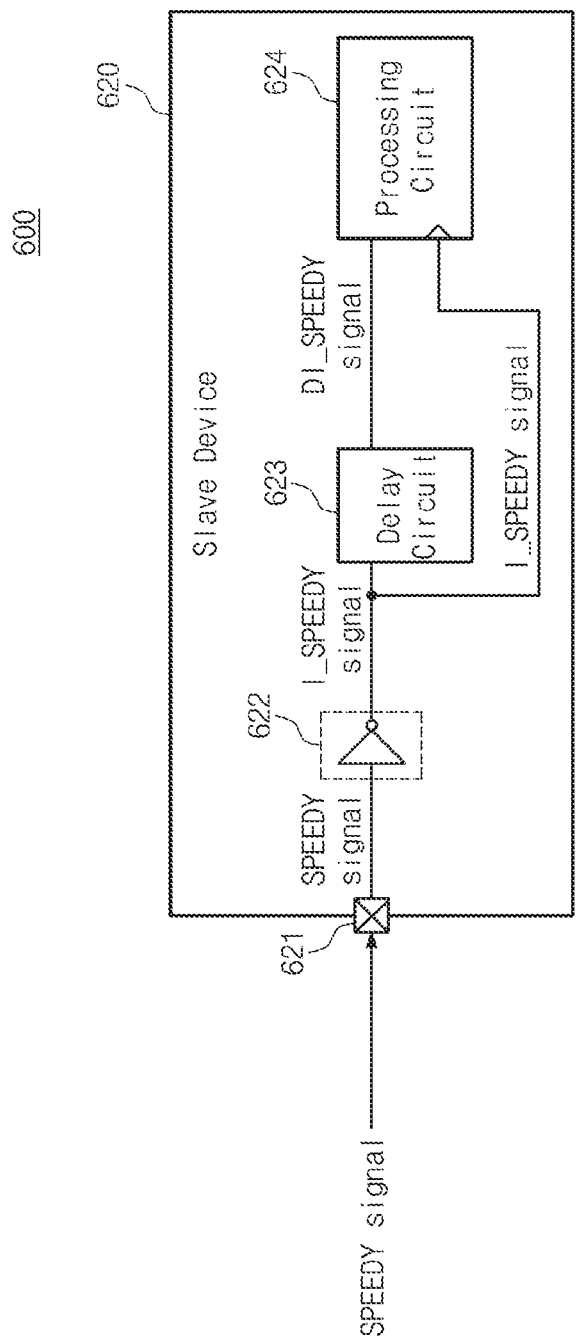
FIG. 15 is a block diagram illustrating a data processing system according to an exemplary embodiment of the inventive concept.
Figure 16:
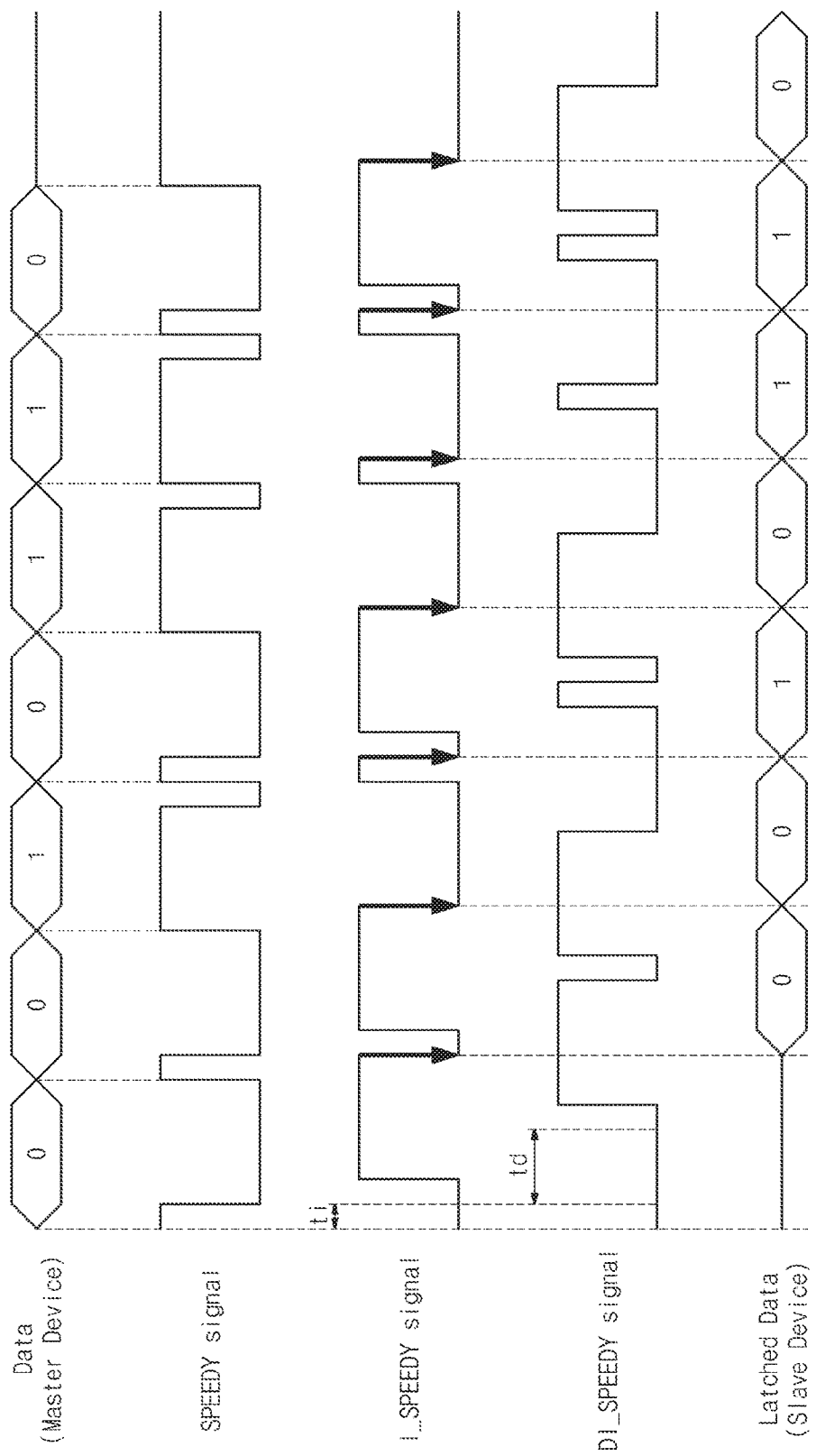
FIG. 16 is a timing diagram showing an operation of a data processing system of FIG. 15, according to an exemplary embodiment of the inventive concept.

FIG. 15 is a block diagram illustrating a data processing system 600 according to an exemplary embodiment of the inventive concept, and FIG. 16 is a timing diagram of an operation of the data processing system 600 of FIG. 15, according to an exemplary embodiment of the inventive concept. The data processing system 600 illustrated in FIG. 15 may be similar to the data processing system 100 illustrated in FIG. 1. Accordingly, similar components will be described using similar reference numerals, and a duplicated or iterative description may be omitted. For descriptive convenience, it is assumed that a SPEEDY signal having a periodic rising edge is transferred to a slave device as described with reference to FIGS. 1 and 2.

Unlike the slave device 120 (see FIG. 1), a slave device 620 illustrated in FIG. 15 may further include a phase inverting circuit 622 between a second pin 621 and a delay circuit 623. The delay circuit 623 of the slave device 620 may receive and delay a phase-inverted SPEEDY signal I_SPEEDY and may generate a delayed I_SPEEDY signal DI_SPEEDY. A processing circuit 624 may receive the I_SPEEDY signal and the DI_SPEEDY signal and may perform a read operation using the I_SPEEDY signal as a clock signal and the DI_SPEEDY signal as a data signal.

For example, referring to FIG. 16, the phase inverting circuit 622 may invert a phase of the SPEEDY signal to generate the I_SPEEDY signal. In this case, a delay may occur by "ti" through the phase inverting circuit 622. Further, unlike the SPEEDY signal whose rising edge is periodic, the phase inversion may allow a falling edge of the I_SPEEDY signal to be periodic. The delay circuit 623 may delay the I_SPEEDY signal by "td" and may generate the DI_SPEEDY signal.

The processing circuit 624 may read data included in the SPEEDY signal by using a falling edge of the I_SPEEDY signal as a clock signal and a duty ratio of the DI_SPEEDY signal as a data signal. When the DI_SPEEDY signal is "H" at a falling edge of the I_SPEEDY signal, the processing circuit 624 may read data corresponding thereto as "0". When the DI_SPEEDY signal is "L" at a falling edge of the I_SPEEDY signal, the processing circuit 624 may read data corresponding thereto as "1".

As such, a data processing system according to an exemplary embodiment of the inventive concept may convert a rising edge of the SPEEDY signal into a falling edge by use of the phase inverting circuit 622 and may read data information included in the SPEEDY signal using the falling edge as a clock signal.

Although, in FIGS. 15 and 16, an exemplary embodiment of the inventive concept is exemplified as a master device generating a SPEEDY signal having a periodic rising edge and a slave device inverting the SPEEDY signal and using a falling edge of the inverted SPEEDY signal as a clock signal, the inventive concept may not be limited thereto. For example, a master device may generate a SPEEDY signal having a periodic falling edge, and a slave device may invert the SPEEDY signal and may use a rising edge of the inverted SPEEDY signal as a clock signal.

In FIGS. 15 and 16, an exemplary embodiment of the inventive concept is exemplified as the phase inverting circuit 622 with one inverter. However, the inventive concept may not be limited thereto. For example, the phase inverting circuit 622 may be implemented with various circuits such as an inverter chain and the like.

Figure 17:
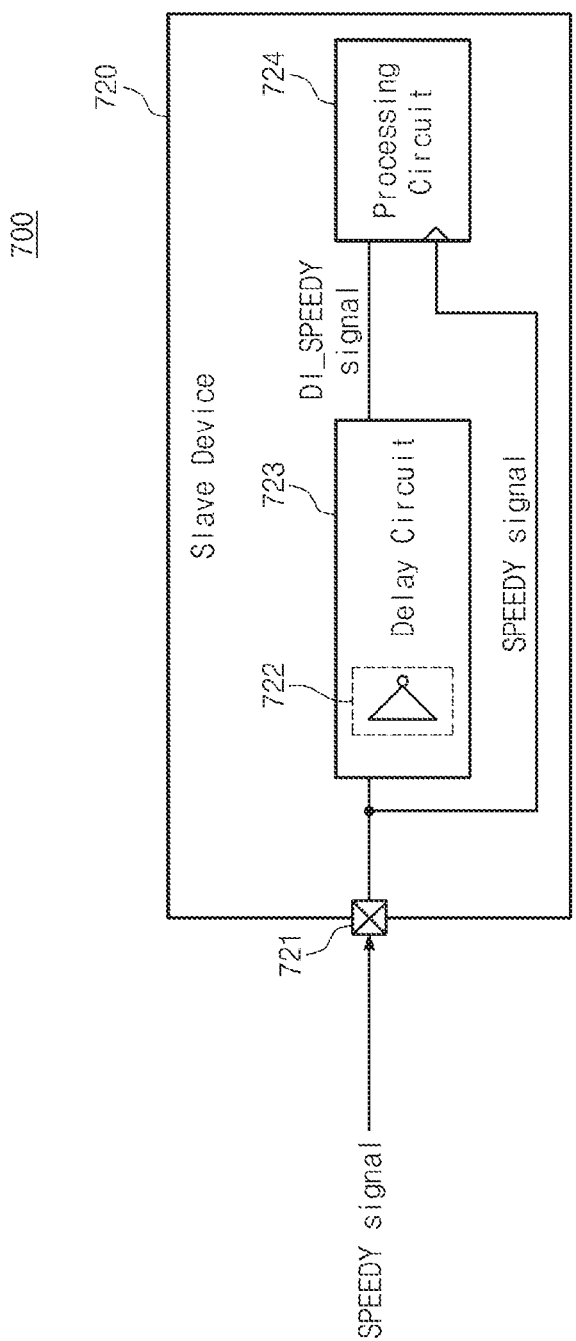
FIG. 17 is a block diagram illustrating a data processing system according to an exemplary embodiment of the inventive concept.
Figure 18:
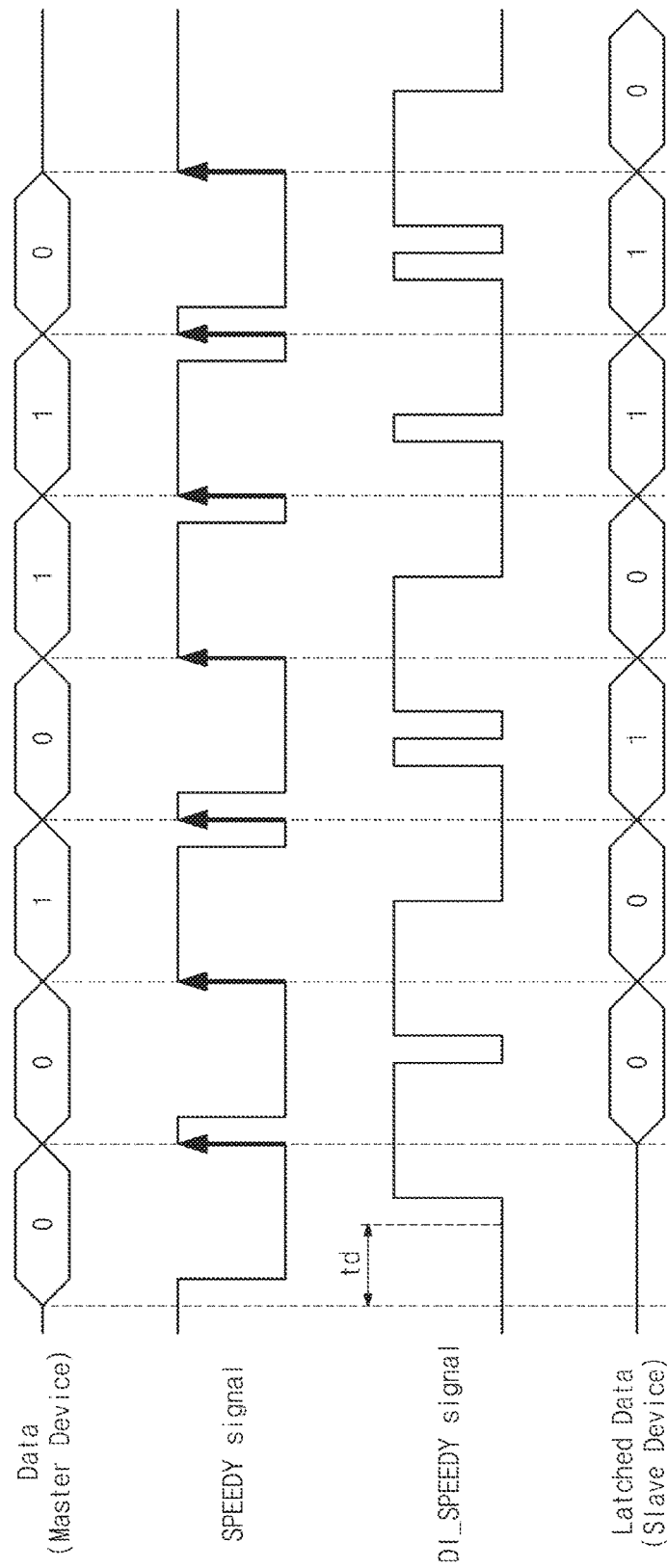
FIG. 18 is a timing diagram showing an operation of a data processing system of FIG. 17, according to an exemplary embodiment of the inventive concept.

FIG. 17 is a block diagram illustrating a data processing system 700 according to an exemplary embodiment of the inventive concept, and FIG. 18 is a timing diagram of an operation of a data processing system 700 of FIG. 17, according to an exemplary embodiment of the inventive concept. The data processing system 700 illustrated in FIG. 17 may be similar to the data processing system 600 illustrated in FIG. 15. Accordingly, similar components will be described using similar reference numerals, and a duplicated or iterative description may be omitted. For descriptive convenience, it is assumed that a SPEEDY signal having a periodic rising edge is transferred to a slave as described with reference to FIGS. 1 and 2.

Unlike the slave device 620 illustrated in FIG. 15, a slave device 720 illustrated in FIG. 17 may be implemented such that a delay circuit 723 includes a phase inverting circuit 722. In this case, the delay circuit 723 may receive a SPEEDY signal, may delay the SPEEDY signal, and may invert a phase of the delayed SPEEDY signal. In other words, the delay circuit 723 may receive the SPEEDY signal and may output a DI_SPEEDY signal. As illustrated in FIG. 17, a processing circuit 724 may perform a read operation using the SPEEDY signal as a clock signal and the DI_SPEEDY signal as a data signal.

For example, referring to FIG. 18, the delay circuit 723 may receive the SPEEDY signal from a second pin 721, may invert a phase thereof, and may delay the inverted SPEEDY signal by "td". Accordingly, the delay circuit 723 may generate the DI_SPEEDY signal.

The processing circuit 724 may read data included in the SPEEDY signal by using a rising edge of the SPEEDY signal as a clock signal and a duty ratio of the DI_SPEEDY signal as a data signal. When the DI_SPEEDY signal is "H" at a rising edge of the SPEEDY signal, the processing circuit 724 may read data corresponding thereto as "0". When the DI_SPEEDY signal is "L" at a rising edge of the SPEEDY signal, the processing circuit 724 may read data corresponding thereto as "1".

As such, a data processing system according to an exemplary embodiment of the inventive concept may read data information included in the SPEEDY signal by using the SPEEDY signal as a clock signal and the DI_SPEEDY signal as a data signal.

Although, in FIGS. 17 and 18, an exemplary embodiment of the inventive concept is exemplified as a master device generating a SPEEDY signal having a periodic rising edge and a slave device using a rising edge of the SPEEDY signal as a clock signal and the DI_SPEEDY signal as a data signal, the inventive concept may not be limited thereto. For example, a master device may generate a SPEEDY signal having a periodic falling edge, and a slave device may use a falling edge of the SPEEDY signal as a clock signal.

Figure 19:
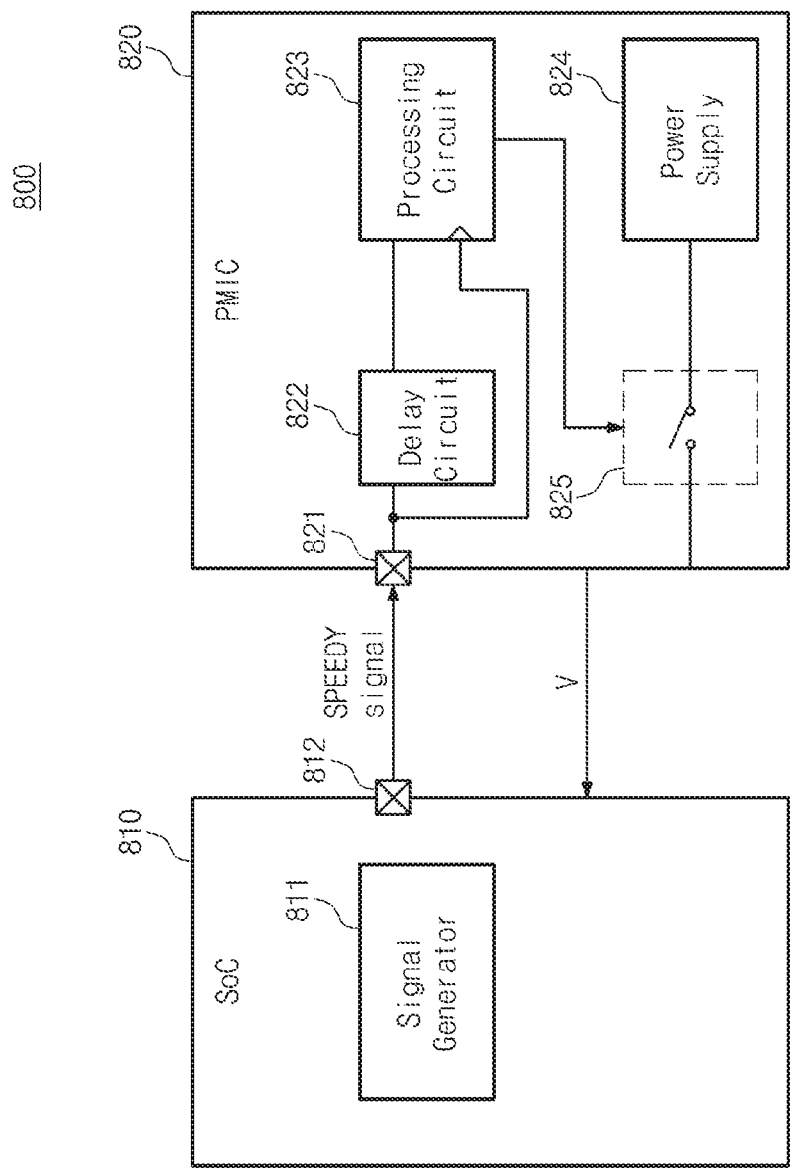
FIG. 19 is a block diagram illustrating a data processing system according to an exemplary embodiment of the inventive concept.

FIG. 19 is a diagram illustrating a data processing system according to an exemplary embodiment of the inventive concept. In FIG. 19, an exemplary embodiment of the inventive concept is exemplified as a data processing system applied to a power management integrated circuit (PMIC).

Referring to FIG. 19, a data processing system 800 may include a system on chip (SoC) 810 and a PMIC 820. The PMIC 820 may provide a voltage which the SoC 810 uses. For example, the PMIC 820 may include a second pin 821, a delay circuit 822, a processing circuit 823, a power supply 824, and a switch circuit 825. The delay circuit 822 and the processing circuit 823 may be used to read a SPEEDY signal and transfer information on a voltage, which the SoC 810 uses, to the switch circuit 825. The SPEEDY signal may be generated by a signal generator 811. The switch circuit 825 may adjust a voltage from the power supply 824 based on the received voltage information and may provide the adjusted voltage V to the SoC 810.

In general, data and a clock signal may be exchanged between a SoC and a PMIC to send information on a voltage, which the SoC uses, to the PMIC. For example, in the case where an interface operation is performed between the SoC and the PMIC for an I2C interface, each of the SoC and the PMIC may have at least two pins.

However, the SoC 810 according to an exemplary embodiment of the inventive concept may send data and a clock signal to the PMIC 820 through a SPEEDY interface technique. Therefore, each of the SoC 810 and the PMIC 820 may include just one pin. Thus, an area used to implement the SoC 810 and the PMIC 820 is reduced.

Figure 20:
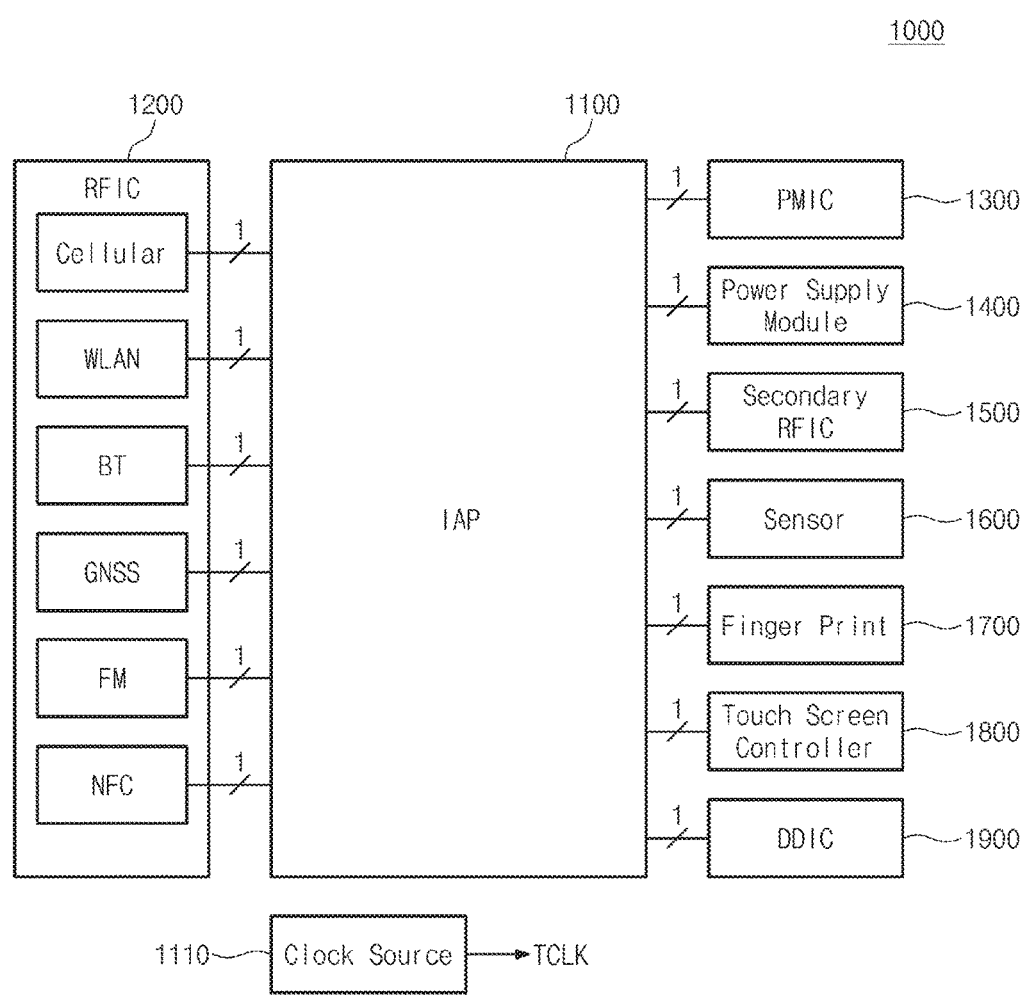
FIG. 20 is a block diagram illustrating a data processing system according to an exemplary embodiment of the inventive concept.

FIG. 20 is a block diagram illustrating a data processing system 1000 according to an exemplary embodiment of the inventive concept.

Referring to FIGS. 1 and 20, a master device 1100 may be a processor capable of controlling slave devices 1200 to 1900, respectively. The master device 1100 and each of the slave devices 1200 to 1900 may be connected over an independent single wire. The master device 1100 may be implemented with, but not limited thereto, a baseband modem processor chip, a chip capable of performing a function of a modem and a function of an AP, an AP, or a mobile AP. A clock source 1110 for generating a clock TCLK may also be included in the data processing system 1000.

The slave devices 1200 to 1900 may include, but not limited thereto, an RFIC 1200, a PMIC 1300, a power supply module 1400, a secondary RFIC 1500, a sensor 1600, a fingerprint recognition chip 1700, a touch screen controller 1800, and a DDIC or a digital display interface chip 1900. The RFIC 1200 may include at least one connectivity chip. For example, the connectivity chip may be, but not limited thereto, a chip for mobile communication (cellular), a chip for wireless local area network (WLAN) communication, a chip for Bluetooth (BT) communication, a chip for global navigation satellite system (GNSS) communication, a chip for processing frequency modulation (FM) audio/video, and/or a chip for near field communication (NFC).

An interface operation may be performed between the master device 1100 and each of the slave devices 1200 to 1900 using a SPEEDY signal, thereby reducing the number of pins used to implement the master device 1100 and each of the slave devices 1200 to 1900. Thus, an area used to implement the master device 1100 and each of the slave devices 1200 to 1900 is reduced. According to an exemplary embodiment of the inventive concept, a data processing system may send data using one pin, thereby reducing price of a chip and reducing power consumption.

While the inventive concept has been described with reference to exemplary embodiments thereof, it will be understood by those of ordinary skill in the art that various changes and modifications may be made thereto without departing from the spirit and scope of the inventive concept as defined by the following claims.

What is claimed is:

1. A system, comprising:
   a master device configured to generate a first signal having a periodic pulse, wherein the first signal includes data; and
   a slave device including a pin, a delay circuit, a buffer, a processing circuit, and a register, wherein the slave device receives the first signal at the pin, delays the first signal with the delay circuit to generate a second signal having a first delay, delays the first signal with the buffer to generate a third signal having a second delay, and reads the data from the second signal using the third signal at the processing circuit,
   wherein a value of the data is based on a duty ratio of the first signal,
   wherein the value of the data is 0 when a logic high duration of the data is less than half of a single periodic pulse, and the value of the data is 1 when the logic high duration of the data is greater than half of a single periodic pulse,
   wherein the register is configured to serially receive the data from the processing circuit, the register including:
   a data storage unit configured to store the data received from the processing circuit;
   a control logic configured to count a number of periods of the third signal and output a control signal when a predetermined number of the periods is reached; and
   an output register configured to output the data stored in the data storage unit in parallel in response to the control signal from the control logic.

2. The system of claim 1, wherein the first delay is greater than the second delay.

3. The system of claim 1, wherein the data is read from the second signal at a rising edge of the third signal.

4. The system of claim 1, wherein the data is read from the second signal at a falling edge of the third signal.

5. The system of claim 1, wherein the processing circuit includes a flip-flop, wherein the register is configured to serially receive the data from the flip-flop.

6. The system of claim 1, wherein the master device includes a pin through which the first signal is output.

7. The system of claim 1, wherein the pin of the master device and the pin of the slave device are connected to each other with a single line.

8. The system of claim 1, wherein the master device includes a signal generator to generate the first signal.

9. A system comprising:
   a master device configured to generate a first signal having a periodic pulse, wherein the first signal includes data; and
   a slave device including a pin, a delay circuit, a buffer, a processing circuit, and a register, wherein the slave device receives the first signal at the pin, delays the first signal with the delay circuit to generate a second signal having a first delay, delays the first signal with the buffer to generate a third signal having a second delay, and reads the data from the second signal using the third signal at the processing circuit,
   wherein a value of the data is based on a duty ratio of the first signal,
   wherein the value of the data is 0 when a logic high duration of the data is less than half of a single periodic pulse, and the value of the data is 1 when the logic high duration of the data is greater than half of a single periodic pulse,
   wherein the register is configured to serially receive the data from the processing circuit, the register including:
   a data storage unit configured to store the data received from the processing circuit, wherein the data includes header data, tail data and payload data;
   a control logic configured to output a control signal when the header and tail data meet a predetermined condition; and
   an output register configured to output the payload data in parallel in response to the control signal output from the control logic.

10. A device, comprising:
    a single pin configured to receive a first signal, the first signal including data and having a periodic pulse;
    a delay circuit configured to delay the first signal and generate a second signal having a first delay;
    a buffer configured to delay the first signal and generate a third signal having a second delay;
    a processing circuit configured to read the data from the second signal using the third signal; and
    a register configured to serially receive the data from the processing circuit,
    wherein a value of the data is based on a duty ratio of the first signal,
    wherein the value of the data is 0 when a logic high duration of the data is less than half of a single periodic pulse, and the value of the data is 1 when the logic high duration of the data is greater than half of a single periodic pulse,
    wherein the register includes:
    a data storage unit configured to store the data received from the processing circuit;
    a control logic configured to count a number of periods of the third signal and output a control signal when a predetermined number of the periods is reached; and
    an output register configured, to output the data stored in the data storage unit in parallel in response to the control signal from the control logic.

11. The device of claim 10, wherein the first delay is longer than the second delay.

12. The device of claim 10, wherein the third signal is a clock signal and the second signal is a data signal.

13. The device of claim 10, wherein the data is read from the second signal at a rising edge or falling edge of the first signal.

14. The device of claim 10, wherein the data is varied according to a duty ratio of the first signal.

15. The device of claim 10, wherein the device operates in a low power mode when reading the data from the second signal.

16. The device of claim 10, wherein the device does not include an internal clock source.

17. A method of operating a slave device, comprising:
receiving, via a pin, a first signal that includes data and has a periodic pulse;
delaying, with a delay circuit, the first signal to generate a second signal having a first delay;
delaying, with a buffer, the first signal to generate a third signal having a second delay;
reading, with a processing circuit, the data from the second signal using the third signal, wherein the data is read from the second signal at a rising edge or a falling edge of the third signal; and
serially receiving, with a register, the data from the processing circuit,
wherein a value of the data is based on a duty ratio of the first signal,
wherein the value of the data is 0 when a logic high duration of the data is less than half of a single periodic pulse, and the value of the data is 1 when the logic high duration of the data is greater than half of a single periodic pulse,
wherein the register includes:
a data storage unit configured to store the data received from the processing circuit;
a control logic configured to count a number of periods of the third signal and output a control signal when a predetermined number of the periods is reached; and
an output register configured to output the data stored in the data storage unit in parallel in response to the control signal from the control logic.

18. The method of claim 17, wherein a value of the data corresponds to a duty ratio of the first signal.

19. The method of claim 18, wherein the value of the data is 0 when logic high duration of the data is less than half of a single periodic pulse, and the value of the data is 1 when logic high duration of the data is greater than half of a single periodic pulse.

* * * * *